(12) United States Patent
Konishi et al.

(10) Patent No.: US 12,150,368 B2
(45) Date of Patent: Nov. 19, 2024

(54) ORGANIC ELECTROLUMINESCENT DISPLAY DEVICE WHICH IS BENDABLE

(71) Applicant: FUJIFILM Corporation, Tokyo (JP)

(72) Inventors: Toshihiro Konishi, Kanagawa (JP); Taro Hashizume, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/169,008

(22) Filed: Feb. 14, 2023

(65) Prior Publication Data

US 2023/0276683 A1    Aug. 31, 2023

(30) Foreign Application Priority Data

Feb. 25, 2022    (JP) ................. 2022-028430

(51) Int. Cl.
*H10K 59/80*    (2023.01)
*G02B 5/30*    (2006.01)
*H10K 77/10*    (2023.01)
*H10K 102/00*    (2023.01)

(52) U.S. Cl.
CPC ......... *H10K 59/879* (2023.02); *G02B 5/3016* (2013.01); *H10K 59/8791* (2023.02); *H10K 59/8793* (2023.02); *H10K 77/111* (2023.02); *H10K 2102/311* (2023.02)

(58) Field of Classification Search
CPC ............. G02B 5/3016; H10K 59/8791; H10K 59/8793; H10K 77/111; H10K 2102/311
See application file for complete search history.

(56) References Cited

U.S. PATENT DOCUMENTS

| | | |
|---|---|---|
| 10,036,840 B2 | 7/2018 | Takeda et al. |
| 2008/0106675 A1* | 5/2008 | Uesaka ................. G02B 27/286 349/98 |
| 2015/0369981 A1 | 12/2015 | Takeda et al. |
| 2016/0011352 A1* | 1/2016 | Saitoh .................. G02B 5/3083 349/194 |
| 2020/0292739 A1* | 9/2020 | Tomohisa ............ G02B 5/3083 |

FOREIGN PATENT DOCUMENTS

JP    2014-170221 A    9/2014

* cited by examiner

*Primary Examiner* — Paisley L Wilson
(74) *Attorney, Agent, or Firm* — Edwards Neils LLC; Jean C. Edwards, Esq.

(57) ABSTRACT

Provided is a bendable organic EL display device in which change in tint at a bending portion before and after bending is small. The organic electroluminescent display device is a bendable organic electroluminescent display device including a circularly polarizing plate and a bendable organic EL display panel, in which the circularly polarizing plate includes a polarizer and a retardation layer from a viewing side, the retardation layer includes a first optically anisotropic layer formed by fixing a liquid crystal compound twist-aligned along a helical axis extending in a thickness direction, and the first optically anisotropic layer satisfies a predetermined requirement.

8 Claims, 4 Drawing Sheets

ORGANIC ELECTROLUMINESCENT DISPLAY DEVICE WHICH IS BENDABLE

CROSS-REFERENCE TO RELATED APPLICATIONS

The present application claims priority under 35 U.S.C. § 119 to Japanese Patent Application No. 2022-028430, filed on Feb. 25, 2022. The above application is hereby expressly incorporated by reference, in its entirety, into the present application.

BACKGROUND OF THE INVENTION

1. Field of the Invention

The present invention relates to an organic electroluminescent display device.

2. Description of the Related Art

In the related art, in order to suppress adverse effects due to external light reflection, a circularly polarizing plate has been used in an organic electroluminescent display device (hereinafter, also referred to as an "organic EL display device").

On the other hand, in recent years, there has been an increasing demand for flexibility (bendability) of the organic EL display device.

However, in a case where the organic EL display device is bent, a large force (partially a tensile force and partially a compressive force) is applied to a phase difference film in the circularly polarizing plate, and a phase difference and an angle of slow axis at that portion change.

For the above-described problems, JP2014-170221A discloses a circularly polarizing plate including a phase difference film exhibiting predetermined optical properties, in which a slow axis direction of the phase difference film is adjusted to define an angle of 20° to 70° with respect to a bending direction of a display device.

SUMMARY OF THE INVENTION

On the other hand, in recent years, further improvement in visibility of a display device has been required, and there is a demand for a further reduction in tint change at a bending portion before and after bending a bendable organic EL display device.

In a case of studying characteristics of a bendable organic EL display device using the circularly polarizing plate disclosed in JP2014-170221A, the present inventors have found that change in tint at a bending portion before and after bending the bendable organic EL display device is large, which does not reach the level required in recent years, and further improvement is necessary.

In view of the above-described circumstances, an object of the present invention is to provide a bendable organic EL display device in which change in tint at a bending portion before and after bending is small.

As a result of intensive studies to solve the above-described problems, the present inventors have completed the present invention having the following configurations.

(1) An organic electroluminescent display device which is bendable, comprising:
a circularly polarizing plate; and
a bendable organic EL display panel,
in which the circularly polarizing plate includes a polarizer and a retardation layer from a viewing side,
the retardation layer includes a first optically anisotropic layer formed by fixing a liquid crystal compound twist-aligned along a helical axis extending in a thickness direction, and
when observing the organic electroluminescent display device from a polarizer side, in a case where a position of an in-plane slow axis of the first optically anisotropic layer on a surface on an organic electroluminescent display panel side and a position of an in-plane slow axis of the first optically anisotropic layer on a surface on the polarizer side are represented by a positive angle value in a clockwise direction and by a negative angle value in a counterclockwise direction with, as a reference, an extending direction of a ridge line formed in a case where the organic electroluminescent display device is bent, and
when observing the organic electroluminescent display device from the polarizer side, in a case where a twisted direction of the liquid crystal compound is represented by clockwise or counterclockwise with, as a reference, the in-plane slow axis of the first optically anisotropic layer on the surface on the organic electroluminescent display panel side, any of requirements A1 to A8 described later is satisfied.

(2) The organic electroluminescent display device according to (1),
in which when observing the organic electroluminescent display device from the polarizer side, in a case where a position of an absorption axis of the polarizer is represented by a positive angle value in a clockwise direction and by a negative angle value in a counterclockwise direction with, as a reference, the extending direction of the ridge line formed in a case where the organic electroluminescent display device is bent, any of requirements B1 to B8 described later is satisfied.

(3) The organic electroluminescent display device according to (1) or (2),
in which the retardation layer includes a second optically anisotropic layer which is a negative A-plate.

(4) The organic electroluminescent display device according to any one of (1) to (3),
in which the retardation layer includes a third optically anisotropic layer which is a positive C-plate.

(5) The organic electroluminescent display device according to any one of (1) to (4),
in which the retardation layer includes a fourth optically anisotropic layer which is a negative C-plate.

(6) The organic electroluminescent display device according to any one of (1) to (5),
in which a thickness of the retardation layer is 20 μm or less.

According to the present invention, it is possible to provide a bendable organic EL display device in which change in tint at a bending portion before and after bending is small.

DESCRIPTION OF THE PREFERRED EMBODIMENTS

Figure 1:
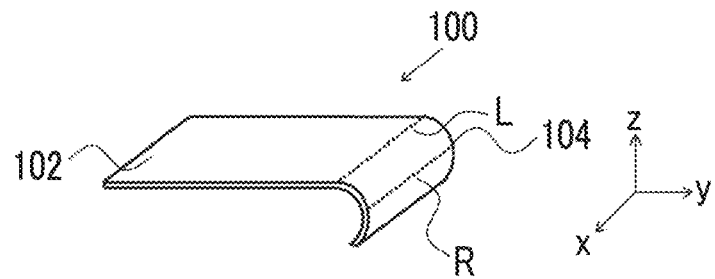
FIG. 1 is a diagram for explaining a ridge line direction.

Hereinafter, the present invention will be described in more detail. The following description of configuration requirements is based on typical embodiments of the present invention, but the present invention is not limited thereto.

Any numerical range expressed using "to" in the present specification refers to a range including the numerical values before and after the "to" as a lower limit value and an upper limit value, respectively.

In addition, in the present specification, "visible light" refers to light in a wavelength range of 380 to 780 nm. In addition, in the present specification, a measurement wavelength is 550 nm unless otherwise specified.

In the present specification, "in-plane slow axis" means a direction in which in-plane refractive index is maximum.

In the present invention, $Re(\lambda)$ and $Rth(\lambda)$ represent an in-plane retardation at a wavelength $\lambda$ and a thickness direction retardation at a wavelength $\lambda$, respectively. Unless otherwise specified, the wavelength $\lambda$ is 550 nm.

In the present invention, $Re(\lambda)$ and $Rth(\lambda)$ are values measured at the wavelength of $\lambda$ in AxoScan (manufactured by Axometrics, Inc.). By inputting an average refractive index $((n_x+n_y+n_z)/3)$ and a film thickness (d (μm)) in AxoScan, slow axis direction (°)
$Re(\lambda)=R0(\lambda)$
$Rth(\lambda)=((n_x+n_y)/2-n_z) \times d$
are calculated.

Although $R0(\lambda)$ is displayed as a numerical value calculated by AxoScan, it means $Re(\lambda)$.

In the present specification, the refractive indices $n_x$, $n_y$, and $n_z$ are measured using an Abbe refractometer (NAR-4T, manufactured by Atago Co., Ltd.) and using a sodium lamp ($\lambda$=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, values in Polymer Handbook (John Wiley & Sons, Inc.) and catalogs of various optical films can be used. The values of the average refractive index of main optical films are exemplified below: cellulose acylate (1.48), cycloolefin polymer (1.52), polycarbonate (1.59), polymethylmethacrylate (1.49), and polystyrene (1.59).

In the present specification, "light" means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Among these, ultraviolet rays are preferable.

In addition, in the present specification, a bonding direction of a divalent group (for example, —O—CO—) described is not particularly limited, and for example, in a case where $L^2$ in a "$L^1$-$L^2$-$L^3$" bond is —O—CO—, and a bonding position on the $L^1$ side is represented by *1 and a bonding position on the $L^3$ side is represented by *2, $L^2$ may be *1-O—CO—*2 or *1-CO—O—*2.

In the present specification, an A-plate and a C-plate are defined as follows.

There are two types of A-plates, a positive A-plate (A-plate which is positive) and a negative A-plate (A-plate which is negative). The positive A-plate satisfies a relationship of Expression (A1) and the negative A-plate satisfies a relationship of Expression (A2) in a case where a refractive index in a film in-plane slow axis direction (in a direction in which an in-plane refractive index is maximum) is defined as $n_x$, a refractive index in an in-plane direction orthogonal to the in-plane slow axis is defined as $n_y$, and a refractive index in a thickness direction is defined as $n_z$. The positive A-plate has an Rth showing a positive value and the negative A-plate has an Rth showing a negative value.

$$n_x > n_y \approx n_z \qquad \text{Expression (A1)}$$

$$n_y < n_x \approx n_z \qquad \text{Expression (A2)}$$

The symbol "≈" encompasses not only a case where both sides are completely the same as each other but also a case where the both sides are substantially the same as each other. The expression "substantially the same" means that, for example, a case where $(n_y-n_z) \times d$ (in which d is a thickness of a film) is −10 to 10 nm and preferably −5 to 5 nm is also included in "$n_y \approx n_z$"; and a case where $(n_x-n_z) \times d$ is −10 to 10 nm and preferably −5 to 5 nm is also included in "$n_x \approx n_z$".

There are two types of C-plates, a positive C-plate (C-plate which is positive) and a negative C-plate (C-plate which is negative). The positive C-plate satisfies a relationship of Expression (C1) and the negative C-plate satisfies a relationship of Expression (C2). The positive C-plate has an Rth showing a negative value and the negative C-plate has an Rth showing a positive value.

$$n_z > n_x \approx n_y \qquad \text{Expression (C1)}$$

$$n_z < n_x \approx n_y \qquad \text{Expression (C2)}$$

The symbol "≈" encompasses not only a case where both sides are completely the same as each other but also a case where the both sides are substantially the same as each other. The expression "substantially the same" means that, for example, a case where $(n_x-n_y) \times d$ (in which d is a thickness of a film) is 0 to 10 nm and preferably 0 to 5 nm is also included in "$n_x \approx n_y$".

In addition, in the present specification, "orthogonal" or "parallel" is intended to include a range of errors acceptable in the art to which the present invention pertains. For example, it means that an angle is in an error range of ±5° with respect to the exact angle, and the error with respect to the exact angle is preferably in a range of ±3°.

In addition, in the present specification, the "fixed" state is a state in which alignment of a liquid crystal compound is maintained. Specifically, the "fixed" state is preferably a state in which, in a temperature range of usually 0° C. to 50°

C. or in a temperature range of −30° C. to 70° C. under more severe conditions, the layer has no fluidity and a fixed alignment morphology can be stably maintained without causing a change in the alignment morphology due to an external field or an external force.

Feature points of the present invention include that a first optically anisotropic layer formed by fixing a liquid crystal compound twist-aligned along a helical axis extending in a thickness direction is used, and that an in-plane slow axis of this first optically anisotropic layer is disposed at a predetermined position with respect to an extending direction of a ridge line formed in a case where an organic electroluminescent display device (hereinafter, simply referred to as an "organic EL display device") is bent.

Hereinafter, an estimation mechanism from which the effects of the present invention are obtained will be described with reference to the accompanying drawings.

First, the above-described ridge line direction will be described in more detail with reference to FIG. 1. FIG. 1 shows an example of an aspect in which the organic EL display device is bent. As shown in FIG. 1, an organic EL display device 100 includes at least a plane portion 102 and a bending portion 104 which is connected (isolated) to the plane portion 102 through a linear bending start line L (boundary line). In FIG. 1, the ridge line direction corresponds to a direction (x direction in FIG. 1) in which a ridge line R of the bending portion 104 in the organic EL display device 100 extends. That is, the ridge line direction is intended to be a direction in which, in a case where the organic EL display device 100 is bent at the bending portion, the ridge line (line which continues from peak to peak of the mountain) formed at the bending portion extends.

The linear bending start line L is positioned at an end part of the plane portion 102 and represents a position where the bending starts.

Figure 2:
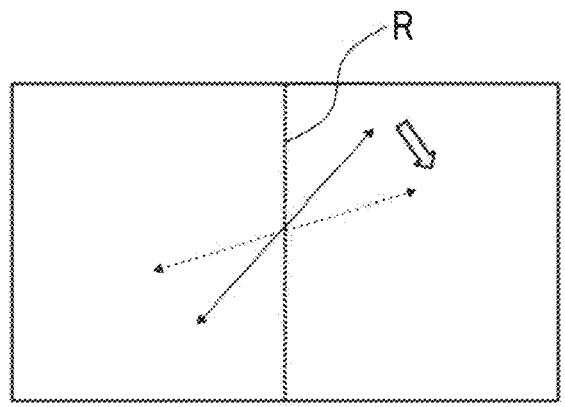
FIG. 2 is a diagram for explaining a problem in the related art.

Next, a case where the organic EL display device using the retardation layer (phase difference film) in the related art, disclosed in JP2014-170221A, is bent will be described. In FIG. 2, the extending direction of the ridge line formed in a case where the organic EL display device is bent is indicated by a broken line R. The retardation layer in the related art is a uniaxially aligned layer and has an in-plane slow axis in a predetermined direction as indicated by a black arrow in FIG. 2. In a case where the organic EL display device is bent, the retardation layer is stretched, and the in-plane slow axis moves in a direction of a white arrow and moves to a position indicated by a broken line. Therefore, change in tint occurs in a vicinity of the bending portion.

Figure 3:
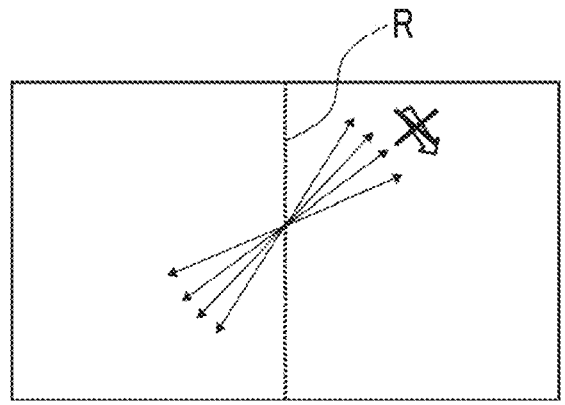
FIG. 3 is a diagram for explaining a mechanism of the present invention.

On the other hand, in the present invention, the first optically anisotropic layer formed by fixing a liquid crystal compound twist-aligned along a helical axis extending in a thickness direction is used. Since the liquid crystal compound is twist-aligned in the first optically anisotropic layer, in the first place, the in-plane slow axis direction of the first optically anisotropic layer, indicated by a black arrow, changes gradually according to a thickness position as shown in FIG. 3. Therefore, even in a case where the first optically anisotropic layer is stretched by bending the organic EL display device, since alignment directions are oriented in various directions, stress is easily relieved. As a result, movement of the in-plane slow axis in the direction of the white arrow shown in FIG. 2 is unlikely to occur. Accordingly, the change in tint is unlikely to occur in the vicinity of the bending portion.

Figure 4:
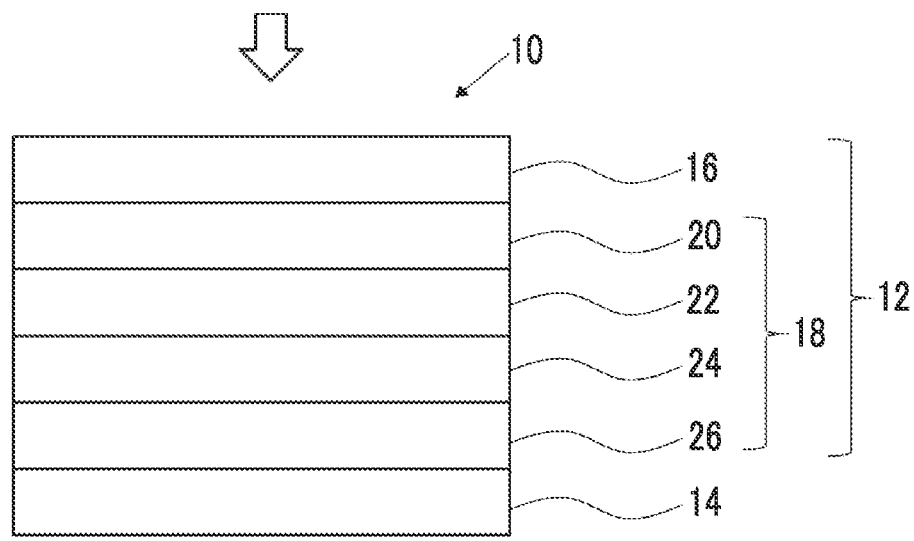
FIG. 4 is a cross-sectional view of an embodiment of the organic EL display device according to the present invention.

Hereinafter, an embodiment of the organic EL display device according to the present invention will be described with reference to the accompanying drawings. FIG. 4 shows a cross-sectional view of the embodiment of the organic EL display device according to the present invention. The drawings in the present invention are schematic views, and the thickness relationship, the positional relationship, and the like of the respective layers do not always match the actual ones. The same applies to the following drawings.

An organic EL display device 10 includes a circularly polarizing plate 12 and an organic EL display panel 14 from a viewing side, the circularly polarizing plate 12 includes a polarizer 16 and a retardation layer 18 from a viewing side, and the retardation layer 18 includes a fourth optically anisotropic layer 20, a second optically anisotropic layer 22, a first optically anisotropic layer 24, and a third optically anisotropic layer 26. The circularly polarizing plate 12 is an optical element which converts unpolarized light into circularly polarized light.

The fourth optically anisotropic layer 20, the second optically anisotropic layer 22, and the third optically anisotropic layer 26 are optional members, and may not be included in the organic EL display device according to the embodiment of the present invention.

In addition, in the first embodiment, the fourth optically anisotropic layer 20, the second optically anisotropic layer 22, and the third optically anisotropic layer 26, which are optional members, are included, but it may be an aspect in which two of the second optically anisotropic layer 22 and the third optically anisotropic layer 26 are included, or an aspect in which only one of the fourth optically anisotropic layer 20, the second optically anisotropic layer 22, or the third optically anisotropic layer 26 is included.

Among these, from the viewpoint that, in a case where the organic EL display device before being bent is viewed from a front direction and an oblique direction, difference in tint between the two is small, the organic EL display device preferably includes at least the second optically anisotropic layer 22 and the third optically anisotropic layer 26, and more preferably includes the fourth optically anisotropic layer 20, the second optically anisotropic layer 22, and the third optically anisotropic layer 26.

In the following, first, each member included in the organic EL display device will be described in detail.

Polarizer

The polarizer 16 may be a member having a function of converting natural light into specific linearly polarized light, and examples thereof include an absorption type polarizer.

The type of the polarizer 16 is not particularly limited, and a commonly used polarizer can be used. Examples thereof include an iodine-based polarizer, a dye-based polarizer using a dichroic substance, and a polyene-based polarizer. The iodine-based polarizer and the dye-based polarizer are generally produced by adsorbing iodine or a dichroic dye on a polyvinyl alcohol, followed by stretching.

A protective film may be disposed on one side or both sides of the polarizer 16.

A thickness of the polarizer 16 is not particularly limited, but from the viewpoint of excellent handleability and excellent optical properties, it is preferably 35 μm or less and more preferably 1 to 25 μm. With the above-described thickness, it is possible to reduce the thickness of the organic EL display device.

Fourth Optically Anisotropic Layer 20

The fourth optically anisotropic layer 20 is a negative C-plate. In FIG. 4, the fourth optically anisotropic layer 20 is disposed between the polarizer 16 and the second optically anisotropic layer 22.

An in-plane retardation of the fourth optically anisotropic layer 20 at a wavelength of 550 nm is not particularly limited, but from the viewpoint that, in a case where the organic EL display device before being bent is viewed from a front direction and an oblique direction, difference in tint between the two is smaller, it is preferably 0 to 10 nm.

A thickness direction retardation of the fourth optically anisotropic layer 20 at a wavelength of 550 nm is not particularly limited, but from the viewpoint that, in a case where the organic EL display device before being bent is viewed from a front direction and an oblique direction, difference in tint between the two is smaller, it is preferably 15 to 60 nm.

A configuration of the fourth optically anisotropic layer 20 is not particularly limited as long as it is a negative C-plate, and examples thereof include a layer formed by fixing a disk-like liquid crystal compound horizontally aligned.

The state in which the disk-like liquid crystal compound is horizontally aligned means that a disc plane of the disk-like liquid crystal compound and a surface of the layer are parallel to each other. It is not required to be strictly parallel to each other, but an angle formed by the disc plane and the thickness direction of the layer is preferably in a range of 0°±20° and more preferably in a range of 0°±10°.

A known compound can be used as the disk-like liquid crystal compound.

Examples of the disk-like liquid crystal compound include compounds described in paragraphs [0020] to [0067] of JP2007-108732A and paragraphs [0013] to [0108] of JP2010-244038A.

The disk-like liquid crystal compound may have a polymerizable group.

The type of the polymerizable group is not particularly limited, but is preferably a functional group capable of an addition polymerization reaction, more preferably a polymerizable ethylenically unsaturated group or a ring-polymerizable group, and still more preferably a (meth)acryloyl group, a vinyl group, a styryl group, or an allyl group.

The fourth optically anisotropic layer 20 is preferably a layer formed by fixing a disk-like liquid crystal compound having a polymerizable group by polymerization. More specifically, the fourth optically anisotropic layer 20 is more preferably a layer formed by, by polymerization, fixing a disk-like liquid crystal compound which is horizontally aligned and has a polymerizable group.

A thickness of the fourth optically anisotropic layer 20 is not particularly limited, but is preferably 10 μm or less, more preferably 0.1 to 5.0 and still more preferably 0.3 to 2.0

The thickness of the fourth optically anisotropic layer 20 is intended to be an average thickness of the fourth optically anisotropic layer 20. The above-described average thickness is obtained by measuring thicknesses of any five or more points of the fourth optically anisotropic layer 20 and arithmetically averaging the measured values.

Second Optically Anisotropic Layer 22

The second optically anisotropic layer 22 is a negative A-plate. In FIG. 4, the second optically anisotropic layer 22 is disposed between the fourth optically anisotropic layer 20 and the first optically anisotropic layer 24.

An in-plane retardation of the second optically anisotropic layer 22 at a wavelength of 550 nm is not particularly limited, but from the viewpoint that, in a case where the organic EL display device before being bent is viewed from a front direction and an oblique direction, difference in tint between the two is smaller, it is preferably 70 to 200 nm and more preferably 80 to 190 nm.

A thickness direction retardation of the second optically anisotropic layer 22 at a wavelength of 550 nm is not particularly limited, but from the viewpoint that, in a case where the organic EL display device before being bent is viewed from a front direction and an oblique direction, difference in tint between the two is smaller, it is preferably −100 to −35 nm and more preferably −95 to −40 nm.

The second optically anisotropic layer 22 may exhibit forward wavelength dispersibility (characteristic that the in-plane retardation decreases as a measurement wavelength increases) or reverse wavelength dispersibility (characteristic that the in-plane retardation increases as the measurement wavelength increases). The above-described forward wavelength dispersibility and reverse wavelength dispersibility are preferably exhibited in a visible light region.

A configuration of the second optically anisotropic layer 22 is not particularly limited as long as it is a negative A-plate, and examples thereof include a layer formed by fixing a disk-like liquid crystal compound which is vertically aligned and in which optical axes (axes orthogonal to a disc plane) are arranged in the same orientation, and a stretching film. Among these, from the viewpoint that, before and after bending the organic EL display device, the change in tint at the bending portion is smaller (hereinafter, also referred to as that "the effect of the present invention is more excellent"), a layer formed by fixing a disk-like liquid crystal compound which is vertically aligned and in which optical axes (axes orthogonal to a disc plane) are arranged in the same orientation is preferable.

The state in which a disk-like liquid crystal compound is vertically aligned means that the disc plane of the disk-like liquid crystal compound and the thickness direction of the layer are parallel to each other. It is not required to be strictly parallel to each other, but an angle formed by the disc plane and the thickness direction of the layer is preferably in a range of 0°±20° and more preferably in a range of 0°±10°.

In addition, the state in which optical axes (axes orthogonal to the disc plane) of the disk-like liquid crystal compound are arranged in the same orientation does not require that the optical axes of the disk-like liquid crystal compound are arranged strictly in the same orientation, but it is intended that, in a case where orientations of the slow axes are measured at any 20 positions in the plane, the maximum difference in slow axis orientation among the slow axis orientations at 20 positions (the difference between two slow axis orientations having the largest difference among the 20 slow axis orientations) is less than 10°.

A known compound can be used as the disk-like liquid crystal compound. Specific examples of the disk-like liquid crystal compound are as described above.

The disk-like liquid crystal compound may have a polymerizable group.

The type of the polymerizable group which may be included in the disk-like liquid crystal compound is as described above.

The second optically anisotropic layer 22 is preferably a layer formed by fixing a disk-like liquid crystal compound having a polymerizable group by polymerization. More specifically, the second optically anisotropic layer 22 is more preferably a layer formed by, by polymerization, fixing a disk-like liquid crystal compound which is vertically aligned and has a polymerizable group, in which the optical axes are arranged in the same orientation.

A thickness of the second optically anisotropic layer 22 is not particularly limited, but is preferably 10 μm or less, more preferably 0.1 to 5.0 and still more preferably 0.3 to 2.0

The thickness of the second optically anisotropic layer 22 is intended to be an average thickness of the second optically anisotropic layer 22. The above-described average thickness is obtained by measuring thicknesses of any five or more points of the second optically anisotropic layer 22 and arithmetically averaging the measured values.

First Optically Anisotropic Layer

The first optically anisotropic layer 24 is a layer formed by fixing a liquid crystal compound twist-aligned along a helical axis extending in a thickness direction.

The first optically anisotropic layer 24 is preferably a layer formed by fixing a so-called chiral nematic phase having a helical structure. In a case of forming the first optically anisotropic layer 24, it is preferable to use at least a liquid crystal compound and a chiral agent described later.

A twisted angle of the liquid crystal compound (twisted angle of the liquid crystal compound in the alignment direction) is adjusted so as to have a relationship of an in-plane slow axis, which will be described later. From the viewpoint that the effect of the present invention is more excellent, it is preferable to be within a range of 85°±30° (within a range of 55° to) 115°, and more preferable to be within a range of 85°±15° (within a range of 70° to 90°).

The twisted angle is measured using an AxoScan (polarimeter) device manufactured by Axometrics, Inc. and using device analysis software of Axometrics, Inc.

In addition, the "liquid crystal compound twist-aligned" is intended to that the liquid crystal compound from one main surface to the other main surface of the first optically anisotropic layer 24 is twisted around the thickness direction of the first optically anisotropic layer 24 as an axis. Along with this, the alignment direction (in-plane slow axis direction) of the liquid crystal compound varies depending on the position of the first optically anisotropic layer 24 in the thickness direction.

In a case where the liquid crystal compound is a rod-like liquid crystal compound, in the twisted alignment, a major axis of the rod-like liquid crystal compound is disposed so as to be parallel to the main surface of the first optically anisotropic layer 24. It is not required to be strictly parallel, but an angle formed by the major axis of the liquid crystal compound and the main surface of the first optically anisotropic layer 24 is preferably in a range of 0°±20° and more preferably in a range of 0°±10°.

A value of a product $\Delta$nd of a refractive index anisotropy $\Delta$n of the first optically anisotropic layer 24 at a wavelength of 550 nm and a thickness d of the first optically anisotropic layer 24 is not particularly limited, but from the viewpoint that, in a case where the organic EL display device before being bent is viewed from a front direction and an oblique direction, difference in tint between the two is smaller, it is preferably 40 to 280 nm and more preferably 100 to 200 nm.

The $\Delta$nd is measured using an AxoScan (polarimeter) device manufactured by Axometrics, Inc. and using device analysis software of Axometrics, Inc.

From the viewpoint that the effect of the present invention is more excellent, an angle formed by the in-plane slow axis of the second optically anisotropic layer 22 and the in-plane slow axis of the first optically anisotropic layer 24 on a surface on the second optically anisotropic layer 22 side is preferably 0° to 10° and more preferably 0° to 5°.

It is preferable that the above-described relationship between the angles is satisfied in any of cases of requirements A1 to A8, which will be described later.

The type of the liquid crystal compound used for forming the first optically anisotropic layer 24 is not particularly limited, and examples thereof include known liquid crystal compounds, particularly rod-like liquid crystal compounds and disk-like liquid crystal compounds.

Examples of the rod-like liquid crystal compound include compounds described in claim 1 of JP1999-513019A (JP-H11-513019A) or paragraphs [0026] to [0098] of JP2005-289980A. Specific examples of the disk-like liquid crystal compound are as described above.

The liquid crystal compound may have a polymerizable group.

The type of the polymerizable group which may be included in the liquid crystal compound is as described above.

The first optically anisotropic layer 24 is preferably a layer formed by fixing a liquid crystal compound having a polymerizable group by polymerization. More specifically, the first optically anisotropic layer 24 is more preferably a layer formed by, by polymerization, fixing a liquid crystal compound which is twisted-aligned and has a polymerizable group.

A thickness of the first optically anisotropic layer 24 is not particularly limited, but is preferably 10 µm or less, more preferably 0.1 to 5.0 µm, and still more preferably 0.3 to 2.0 µm.

The thickness of the first optically anisotropic layer 24 is intended to be an average thickness of the first optically anisotropic layer 24. The above-described average thickness is obtained by measuring thicknesses of any five or more points of the first optically anisotropic layer 24 and arithmetically averaging the measured values.

Third Optically Anisotropic Layer

The third optically anisotropic layer 26 is a positive C-plate. In FIG. 4, the third optically anisotropic layer 26 is disposed between the first optically anisotropic layer 24 and the organic EL display panel 14.

An in-plane retardation of the third optically anisotropic layer 26 at a wavelength of 550 nm is not particularly limited, but from the viewpoint that, in a case where the organic EL display device before being bent is viewed from a front direction and an oblique direction, difference in tint between the two is smaller, it is preferably 0 to 10 nm.

A thickness direction retardation of the third optically anisotropic layer 26 at a wavelength of 550 nm is not particularly limited, but from the viewpoint that, in a case where the organic EL display device before being bent is viewed from a front direction and an oblique direction, difference in tint between the two is smaller, it is preferably −120 to −10 nm and more preferably −100 to −30 nm.

A configuration of the third optically anisotropic layer 26 is not particularly limited as long as it is a positive C-plate, and examples thereof include a layer formed by fixing a rod-like liquid crystal compound vertically aligned.

The state in which the rod-like liquid crystal compound is vertically aligned means that a major axis of the rod-like liquid crystal compound and a thickness direction of the layer are parallel to each other. It is not required to be strictly parallel to each other, but an angle formed by the disc plane and the thickness direction of the layer is preferably in a range of 0°±20° and more preferably in a range of 0°±10°.

A known compound can be used as the rod-like liquid crystal compound. Specific examples of the rod-like liquid crystal compound are as described above.

The rod-like liquid crystal compound may have a polymerizable group.

The type of the polymerizable group which may be included in the rod-like liquid crystal compound is not particularly limited, and is as described above.

The third optically anisotropic layer 26 is preferably a layer formed by fixing a rod-like liquid crystal compound having a polymerizable group by polymerization. More specifically, the third optically anisotropic layer 26 is more preferably a layer formed by, by polymerization, fixing a rod-like liquid crystal compound which is vertically aligned and has a polymerizable group.

A thickness of the third optically anisotropic layer 26 is not particularly limited, but is preferably 10 μm or less, more preferably 0.1 to 5.0 and still more preferably 0.3 to 2.0

The thickness of the third optically anisotropic layer 26 is intended to be an average thickness of the third optically anisotropic layer 26. The above-described average thickness is obtained by measuring thicknesses of any five or more points of the third optically anisotropic layer 26 and arithmetically averaging the measured values.

Organic EL Display Panel

The organic EL display panel 14 is a bendable panel. In general, the bendable organic EL display panel is often bendable in a specific direction.

As such an organic EL display panel 14, an organic EL display panel having a known configuration can be used, and usually, the organic EL display panel has a structure in which an organic light emitting layer (organic electroluminescence layer) is sandwiched between electrodes (between a cathode and an anode).

Other Layers

The organic EL display device according to the embodiment of the present invention may include a layer other than the above-described members.

Examples of the other members include an adhesion layer. The organic EL display device according to the embodiment of the present invention may include an adhesion layer between the members.

Examples of the adhesion layer include known pressure sensitive adhesive layers and adhesive layers.

In addition, examples of the other members include an alignment film.

The alignment film can be formed by methods such as rubbing treatment of an organic compound (preferably a polymer), oblique vapor deposition of an inorganic compound, formation of a layer having microgrooves, or accumulation of an organic compound (for example, w-tricosanoic acid, dioctadecylmethylammonium chloride, or methyl stearate) by the Langmuir-Blodgett method (LB film).

Furthermore, there is also known an alignment film capable of expressing an alignment function by application of an electric field, application of a magnetic field, or light (preferably polarized light) irradiation.

The alignment film is preferably formed by a rubbing treatment of a polymer.

Examples of the alignment film include a photo-alignment film.

A thickness of the alignment film is not particularly limited as long as it can exhibit an alignment function, but is preferably 0.01 to 5.0 μm, more preferably 0.05 to 2.0 μm, and still more preferably 0.1 to 0.5 μm.

The alignment film may be detachable from the retardation layer together with a substrate described later.

Retardation Layer

The organic EL display device 10 includes the retardation layer 18 including the above-described first optically anisotropic layer 24 to fourth optically anisotropic layer 20.

A thickness of the retardation layer 18 is not particularly limited, but from the viewpoint of reducing the thickness of the organic EL display device, it is preferably 20 μm or less and more preferably 10 μm or less. The lower limit thereof is not particularly limited, but is usually 1.0 μm or more.

In a case where the adhesion layer is included between each layer of the first optically anisotropic layer 24 to the fourth optically anisotropic layer 20, the above-described thickness of the retardation layer 18 is included to be a thickness including the adhesion layer.

The retardation layer 18 preferably functions as a so-called λ/4 plate.

The λ/4 plate is a plate having a function of converting linearly polarized light having a specific wavelength into circularly polarized light (or circularly polarized light into linearly polarized light). More specifically, the λ/4 plate is a plate in which the in-plane retardation Re at a predetermined wavelength λ nm is λ/4 (or an odd multiple thereof).

An in-plane retardation (Re(550)) of the retardation layer 18 at a wavelength of 550 nm may have an error of approximately 25 nm based on an ideal value (137.5 nm), and is, for example, preferably 110 to 160 nm and more preferably 120 to 150 nm.

Axis Relationship in Organic EL Display Device

Next, a positional relationship of the in-plane slow axis of the first optically anisotropic layer 24 included in the organic EL display device 10 will be described.

In the organic EL display device 10, it is sufficient that any one of requirements A1 to A8 described below is satisfied. Among these, from the viewpoint that the effect of the present invention is more excellent, it is preferable to satisfy any one of requirement A1, A2, A5, or A6.

Hereinafter, each requirement will be described in detail with reference to the accompanying drawings.

Requirement A1

Figure 5:
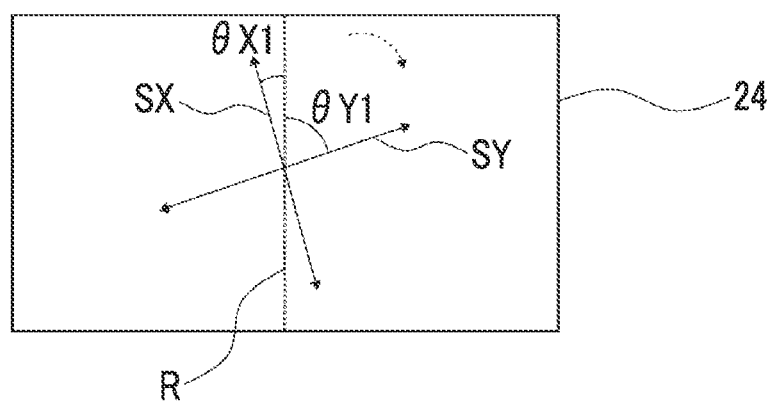
FIG. 5 is a diagram for explaining an example of an aspect in which a requirement A1 is satisfied.

FIG. 5 is a diagram for explaining an example of an aspect in which a requirement A1 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 5, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A1 is satisfied, as shown in FIG. 5, an angle θX1 formed by the in-plane slow axis SX of the first optically anisotropic layer 24 on the surface on the organic EL display panel 14 side and the extending direction of the ridge line R is 5°. More specifically, the in-plane slow axis SX of the first optically anisotropic layer 24 on the surface on the organic EL display panel 14 side is positioned at −5° with respect to the extending direction of the ridge line R. In FIG. 5, the aspect in which the in-plane slow axis SX of the first optically anisotropic layer 24 on the surface on the organic EL display panel 14 side is positioned at −5° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of −20° to 10° and more preferably within a range of −10° to 0°.

In addition, an angle $\theta Y1$ formed by the in-plane slow axis SY of the first optically anisotropic layer 24 on the surface on the polarizer 16 side and the extending direction of the ridge line R is 76°. More specifically, the in-plane slow axis SY of the first optically anisotropic layer 24 on the surface on the polarizer 16 side is positioned at 76° with respect to the extending direction of the ridge line R. In FIG. 5, the aspect in which the in-plane slow axis SY of the first optically anisotropic layer 24 on the surface on the polarizer 16 side is positioned at 76° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of 65° to 95° and more preferably within a range of 75° to 85°.

In addition, in FIG. 5, the twisted direction of the liquid crystal compound is clockwise (see the broken line arrow).

That is, it is preferable that the organic EL display device 10 satisfies the following requirement A1.

Requirement A1: the in-plane slow axis of the first optically anisotropic layer on the surface on the organic EL display panel is positioned within a range of −20° to 10°, the in-plane slow axis of the first optically anisotropic layer on the surface on the polarizer side is positioned within a range of 65° to 95°, and the twisted direction of the liquid crystal compound is clockwise.

In addition, with satisfying the requirement A1, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of −10° to 10° and more preferably within a range of −5° to 5°.

That is, it is preferable that the organic EL display device 10 satisfies the following requirement B1.

Requirement B1: the requirement A1 is satisfied, and the absorption axis of the polarizer is positioned within a range of −10° to 10°.

Requirement A2

Figure 6:
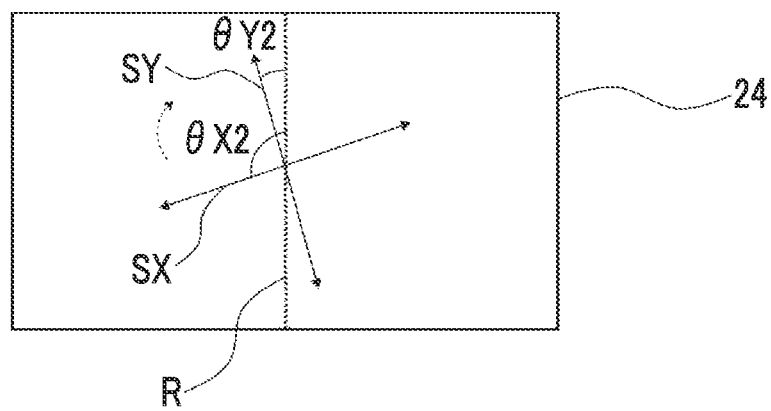
FIG. 6 is a diagram for explaining an example of an aspect in which a requirement A2 is satisfied.

FIG. 6 is a diagram for explaining an example of an aspect in which a requirement A2 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 6, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A2 is satisfied, as shown in FIG. 6, an angle $\theta X2$ formed by the in-plane slow axis SX of the first optically anisotropic layer 24 on the surface on the organic EL display panel 14 side and the extending direction of the ridge line R is 95°. More specifically, the in-plane slow axis SX of the first optically anisotropic layer 24 on the surface on the organic EL display panel 14 side is positioned at −95° with respect to the extending direction of the ridge line R. In FIG. 6, the aspect in which the in-plane slow axis SX of the first optically anisotropic layer 24 on the surface on the organic EL display panel 14 side is positioned at −95° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of −110° to −80° and more preferably within a range of −100° to −90°.

In addition, an angle $\theta Y2$ formed by the in-plane slow axis SY of the first optically anisotropic layer 24 on the surface on the polarizer 16 side and the extending direction of the ridge line R is 14°. More specifically, the in-plane slow axis SY of the first optically anisotropic layer 24 on the surface on the polarizer 16 side is positioned at −14° with respect to the extending direction of the ridge line R. In FIG. 6, the aspect in which the in-plane slow axis SY of the first optically anisotropic layer 24 on the surface on the polarizer 16 side is positioned at −14° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of −25° to 5° and more preferably within a range of −15° to −5°.

In addition, in FIG. 6, the twisted direction of the liquid crystal compound is clockwise (see the broken line arrow).

That is, it is preferable that the organic EL display device 10 satisfies the following requirement A2.

Requirement A2: the in-plane slow axis of the first optically anisotropic layer on the surface on the organic EL display panel is positioned within a range of −110° to −80°, the in-plane slow axis of the first optically anisotropic layer on the surface on the polarizer side is positioned within a range of −25° to 5°, and the twisted direction of the liquid crystal compound is clockwise.

In addition, with satisfying the requirement A2, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of 80° to 100° and more preferably within a range of 85° to 95°.

That is, it is preferable that the organic EL display device 10 satisfies the following requirement B2.

Requirement B2: the requirement A2 is satisfied, and the absorption axis of the polarizer is positioned within a range of 80° to 100°.

Requirement A3

Figure 7:
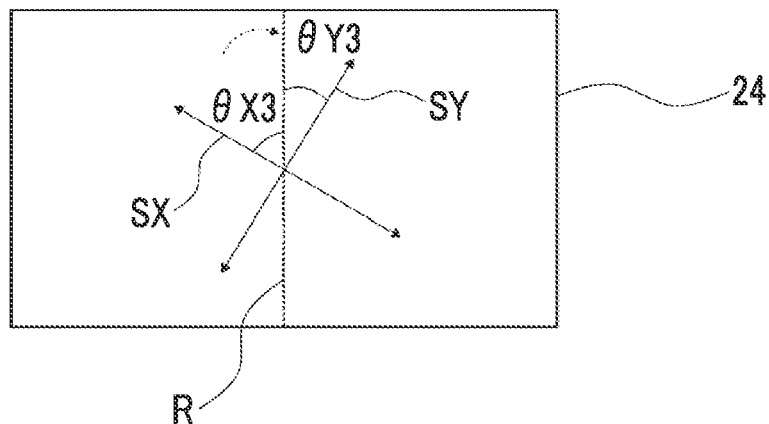
FIG. 7 is a diagram for explaining an example of an aspect in which a requirement A3 is satisfied.

FIG. 7 is a diagram for explaining an example of an aspect in which a requirement A3 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 7, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A3 is satisfied, as shown in FIG. 7, an angle θX3 formed by the in-plane slow axis SX of the first optically anisotropic layer 24 on the surface on the organic EL display panel 14 side and the extending direction of the ridge line R is 50°. More specifically, the in-plane slow axis SX of the first optically anisotropic layer 24 on the surface on the organic EL display panel 14 side is positioned at −50° with respect to the extending direction of the ridge line R. In FIG. 7, the aspect in which the in-plane slow axis SX of the first optically anisotropic layer 24 on the surface on the organic EL display panel 14 side is positioned at −50° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of −65° to −35° and more preferably within a range of −55° to −45°.

In addition, an angle θY3 formed by the in-plane slow axis SY of the first optically anisotropic layer 24 on the surface on the polarizer 16 side and the extending direction of the ridge line R is 31°. More specifically, the in-plane slow axis SY of the first optically anisotropic layer 24 on the surface on the polarizer 16 side is positioned at 31° with respect to the extending direction of the ridge line R. In FIG. 7, the aspect in which the in-plane slow axis SY of the first optically anisotropic layer 24 on the surface on the polarizer 16 side is positioned at 31° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of 20° to 50° and more preferably within a range of 30° to 40°.

In addition, in FIG. 7, the twisted direction of the liquid crystal compound is clockwise.

That is, it is preferable that the organic EL display device 10 satisfies the following requirement A3.

Requirement A3: the in-plane slow axis of the first optically anisotropic layer on the surface on the organic EL display panel is positioned within a range of −65° to −35°, the in-plane slow axis of the first optically anisotropic layer on the surface on the polarizer side is positioned within a range of 20° to 50°, and the twisted direction of the liquid crystal compound is clockwise.

In addition, with satisfying the requirement A3, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of −55° to −35° and more preferably within a range of −50° to −40°.

That is, it is preferable that the organic EL display device 10 satisfies the following requirement B3.

Requirement B3: the requirement A3 is satisfied, and the absorption axis of the polarizer is positioned within a range of −55° to −35°.

Requirement A4

Figure 8:
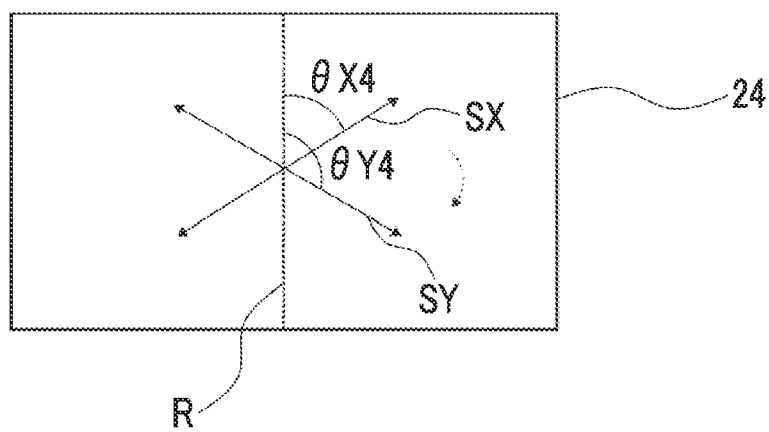
FIG. 8 is a diagram for explaining an example of an aspect in which a requirement A4 is satisfied.

FIG. 8 is a diagram for explaining an example of an aspect in which a requirement A4 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 8, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A4 is satisfied, as shown in FIG. 8, an angle θX4 formed by the in-plane slow axis SX of the first optically anisotropic layer 24 on the surface on the organic EL display panel 14 side and the extending direction of the ridge line R is 40°. More specifically, the in-plane slow axis SX of the first optically anisotropic layer 24 on the surface on the organic EL display panel 14 side is positioned at 40° with respect to the extending direction of the ridge line R. In FIG. 8, the aspect in which the in-plane slow axis SX of the first optically anisotropic layer 24 on the surface on the organic EL display panel 14 side is positioned at 40° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of 25° to 55° and more preferably within a range of 35° to 45°.

In addition, an angle θY4 formed by the in-plane slow axis SY of the first optically anisotropic layer 24 on the surface on the polarizer 16 side and the extending direction of the ridge line R is 121°. More specifically, the in-plane slow axis SY of the first optically anisotropic layer 24 on the surface on the polarizer 16 side is positioned at 121° with respect to the extending direction of the ridge line R. In FIG. 8, the aspect in which the in-plane slow axis SY of the first optically anisotropic layer 24 on the surface on the polarizer 16 side is positioned at 121° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of 110° to 140° and more preferably within a range of 120° to 130°.

In addition, in FIG. 8, the twisted direction of the liquid crystal compound is clockwise.

That is, it is preferable that the organic EL display device 10 satisfies the following requirement A4.

Requirement A4: the in-plane slow axis of the first optically anisotropic layer on the surface on the organic EL display panel is positioned within a range of 25° to 55°, the in-plane slow axis of the first optically anisotropic layer on the surface on the polarizer side is positioned within a range of 110° to 140°, and the twisted direction of the liquid crystal compound is clockwise.

In addition, with satisfying the requirement A4, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of 35° to 55° and more preferably within a range of 40° to 50°.

That is, it is preferable that the organic EL display device 10 satisfies the following requirement B4.

Requirement B4: the requirement A4 is satisfied, and the absorption axis of the polarizer is positioned within a range of 35° to 55°.

Requirement A5

Figure 9:
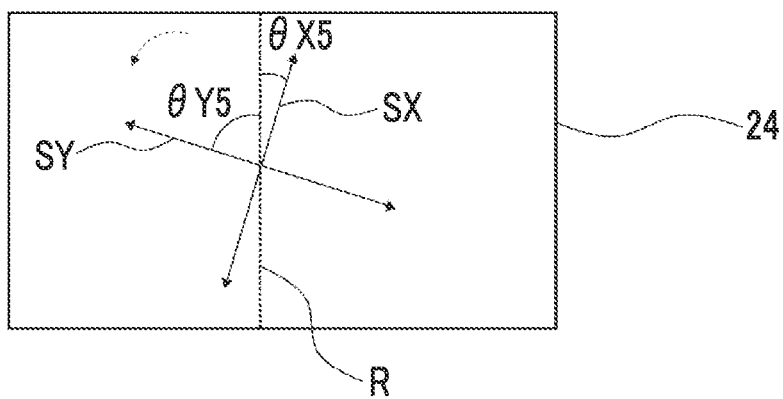
FIG. 9 is a diagram for explaining an example of an aspect in which a requirement A5 is satisfied.

FIG. 9 is a diagram for explaining an example of an aspect in which a requirement A5 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 9, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A5 is satisfied, as shown in FIG. 9, an angle θX5 formed by the in-plane slow axis SX of the first optically anisotropic layer 24 on the surface on the organic EL display panel 14 side and the extending direction of the ridge line R is 5°. More specifically, the in-plane slow axis SX of the first optically anisotropic layer 24 on the surface on the organic EL display panel 14 side is positioned at 5° with respect to the extending direction of the ridge line R. In FIG. 9, the aspect in which the in-plane slow axis SX of the first optically anisotropic layer 24 on the surface on the organic EL display panel 14 side is positioned at 5° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of −10° to 20° and more preferably within a range of 0° to 10°.

In addition, an angle θY5 formed by the in-plane slow axis SY of the first optically anisotropic layer 24 on the surface on the polarizer 16 side and the extending direction of the ridge line R is 80°. More specifically, the in-plane slow axis SY of the first optically anisotropic layer 24 on the surface on the polarizer 16 side is positioned at −80° with respect to the extending direction of the ridge line R. In FIG. 9, the aspect in which the in-plane slow axis SY of the first optically anisotropic layer 24 on the surface on the polarizer 16 side is positioned at −80° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of −95° to −65° and more preferably within a range of −85° to −75°.

In addition, in FIG. 9, the twisted direction of the liquid crystal compound is counterclockwise.

That is, it is preferable that the organic EL display device 10 satisfies the following requirement A5.

Requirement A5: the in-plane slow axis of the first optically anisotropic layer on the surface on the organic electroluminescent display panel side is positioned within a range of −10° to 20°, the in-plane slow axis of the first optically anisotropic layer on the surface on the polarizer side is positioned within a range of −95° to −65°, and the twisted direction of the liquid crystal compound is counterclockwise.

In addition, with satisfying the requirement A5, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of −10° to 10° and more preferably within a range of −5° to 5°.

That is, it is preferable that the organic EL display device 10 satisfies the following requirement B5.

Requirement B5: the requirement A5 is satisfied, and the absorption axis of the polarizer is positioned within a range of −10° to 10°.

Requirement A6

Figure 10:
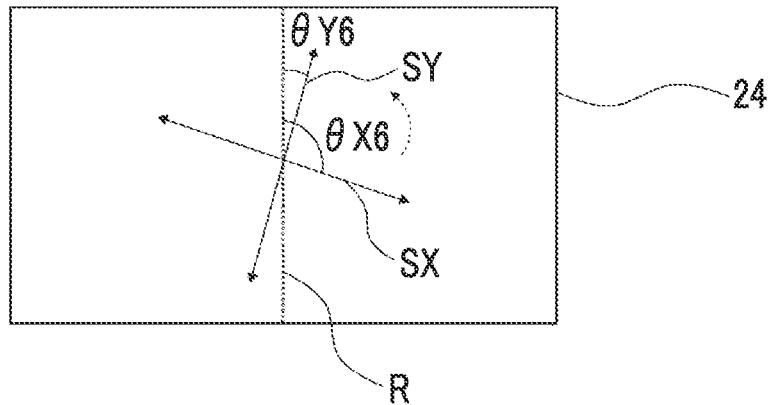
FIG. 10 is a diagram for explaining an example of an aspect in which a requirement A6 is satisfied.

FIG. 10 is a diagram for explaining an example of an aspect in which a requirement A6 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 10, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A6 is satisfied, as shown in FIG. 10, an angle θX6 formed by the in-plane slow axis SX of the first optically anisotropic layer 24 on the surface on the organic EL display panel 14 side and the extending direction of the ridge line R is 95°. More specifically, the in-plane slow axis SX of the first optically anisotropic layer 24 on the surface on the organic EL display panel 14 side is positioned at 95° with respect to the extending direction of the ridge line R. In FIG. 10, the aspect in which the in-plane slow axis SX of the first optically anisotropic layer 24 on the surface on the organic EL display panel 14 side is positioned at 95° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of 80° to 110° and more preferably within a range of 90° to 100°.

In addition, an angle θY6 formed by the in-plane slow axis SY of the first optically anisotropic layer 24 on the surface on the polarizer 16 side and the extending direction of the ridge line R is 10°. More specifically, the in-plane slow axis SY of the first optically anisotropic layer 24 on the surface on the polarizer 16 side is positioned at 10° with respect to the extending direction of the ridge line R. In FIG. 10, the aspect in which the in-plane slow axis SY of the first optically anisotropic layer 24 on the surface on the polarizer 16 side is positioned at 10° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of −5° to 25° and more preferably within a range of 5° to 15°.

In addition, in FIG. 10, the twisted direction of the liquid crystal compound is counterclockwise.

That is, it is preferable that the organic EL display device 10 satisfies the following requirement A6.

Requirement A6: the in-plane slow axis of the first optically anisotropic layer on the surface on the organic EL display panel is positioned within a range of 80° to 110°, the in-plane slow axis of the first optically anisotropic layer on the surface on the polarizer side is positioned within a range of −5° to 25°, and the twisted direction of the liquid crystal compound is counterclockwise.

In addition, with satisfying the requirement A6, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of 80° to 100° and more preferably within a range of 85° to 95°.

That is, it is preferable that the organic EL display device 10 satisfies the following requirement B6.

Requirement B6: the requirement A6 is satisfied, and the absorption axis of the polarizer is positioned within a range of 80° to 100°.

Requirement A7

Figure 11:
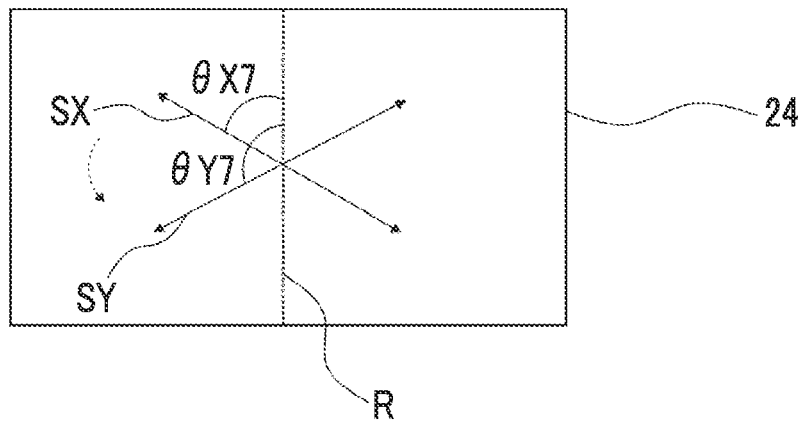
FIG. 11 is a diagram for explaining an example of an aspect in which a requirement A7 is satisfied.

FIG. 11 is a diagram for explaining an example of an aspect in which a requirement A7 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 11, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A7 is satisfied, as shown in FIG. 11, an angle θX7 formed by the in-plane slow axis SX of the first optically anisotropic layer 24 on the surface on the organic EL display panel 14 side and the extending direction of the ridge line R is 40°. More specifically, the in-plane slow axis SX of the first optically anisotropic layer 24 on the surface on the organic EL display panel 14 side is positioned at −40° with respect to the extending direction of the ridge line R. In FIG. 11, the aspect in which the in-plane slow axis SX of the first optically anisotropic layer 24 on the surface on the organic EL display panel 14 side is positioned at −40° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of −55° to −25° and more preferably within a range of −45° to −35°.

In addition, an angle θY7 formed by the in-plane slow axis SY of the first optically anisotropic layer 24 on the surface on the polarizer 16 side and the extending direction of the ridge line R is 125°. More specifically, the in-plane slow axis SY of the first optically anisotropic layer 24 on the surface on the polarizer 16 side is positioned at −125° with respect to the extending direction of the ridge line R. In FIG. 11, the aspect in which the in-plane slow axis SY of the first optically anisotropic layer 24 on the surface on the polarizer 16 side is positioned at −125° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of −140° to −110° and more preferably within a range of −130° to −120°.

In addition, in FIG. 11, the twisted direction of the liquid crystal compound is counterclockwise.

That is, it is preferable that the organic EL display device 10 satisfies the following requirement A7.

Requirement A7: the in-plane slow axis of the first optically anisotropic layer on the surface on the organic EL display panel is positioned within a range of −55° to −25°, the in-plane slow axis of the first optically anisotropic layer on the surface on the polarizer side is positioned within a range of −140° to −110°, and the twisted direction of the liquid crystal compound is counterclockwise.

In addition, with satisfying the requirement A7, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of −55° to −35° and more preferably within a range of −50° to −40°.

That is, it is preferable that the organic EL display device 10 satisfies the following requirement B7.

Requirement B7: the requirement A7 is satisfied, and the absorption axis of the polarizer is positioned within a range of −55° to −35°.

Requirement A8

Figure 12:
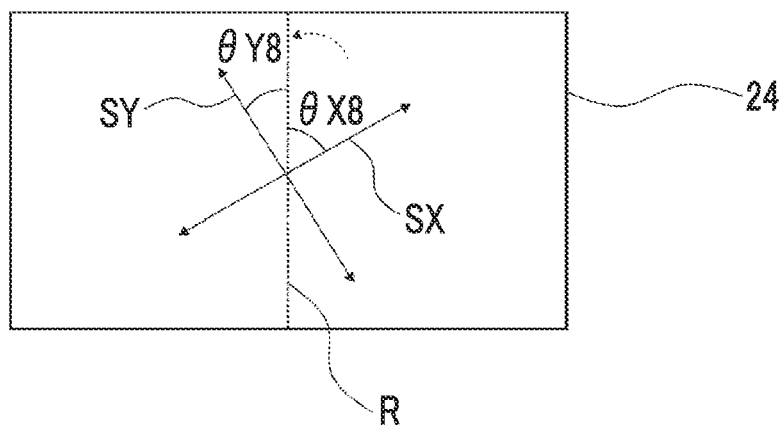
FIG. 12 is a diagram for explaining an example of an aspect in which a requirement A8 is satisfied.

FIG. 12 is a diagram for explaining an example of an aspect in which a requirement A8 is satisfied, and is a diagram showing an angle relationship between a ridge line R (broken line) formed in a case where the organic EL display device 10 is bent at the bending portion, and an in-plane slow axis SX (solid line) of the first optically anisotropic layer 24 on the surface on the organic EL display panel 14 side and an in-plane slow axis SY (solid line) of the first optically anisotropic layer 24 on the surface on the polarizer 16 side, in a case where the organic EL display device 10 is observed from the white arrow in FIG. 4.

In addition, in FIG. 12, the ridge line R formed in a case where the organic EL display device 10 is bent at the bending portion is indicated.

In a case where the organic EL display device 10 is observed from the white arrow in FIG. 4, a position (rotation angle) of the in-plane slow axis is represented by a positive angle value in a clockwise direction and by a negative angle value in a counterclockwise direction, with an extending direction of the ridge line R as a reference (0°).

In addition, in a case where the organic EL display device 10 is observed from the white arrow in FIG. 4, a twisted direction of the liquid crystal compound is determined to be clockwise or counterclockwise with, as a reference, the in-plane slow axis of the first optically anisotropic layer 24 on the surface on the organic EL display panel side.

In the example of the aspect in which the requirement A8 is satisfied, as shown in FIG. 12, an angle θX8 formed by the in-plane slow axis SX of the first optically anisotropic layer 24 on the surface on the organic EL display panel 14 side and the extending direction of the ridge line R is 50°. More specifically, the in-plane slow axis SX of the first optically anisotropic layer 24 on the surface on the organic EL display panel 14 side is positioned at 50° with respect to the extending direction of the ridge line R. In FIG. 12, the aspect in which the in-plane slow axis SX of the first optically anisotropic layer 24 on the surface on the organic EL display panel 14 side is positioned at 50° with the extending direction of the ridge line R as a reference is shown, but the present embodiment is not limited to this aspect, and with the extending direction of the ridge line R as a reference, the in-plane slow axis SX of the first optically anisotropic layer 24 on the surface on the organic EL display panel 14 side is positioned preferably within a range of 35° to 65° and more preferably within a range of 45° to 55°.

In addition, an angle θY8 formed by the in-plane slow axis SY of the first optically anisotropic layer 24 on the surface on the polarizer 16 side and the extending direction of the ridge line R is 35°. More specifically, the in-plane slow axis SY of the first optically anisotropic layer 24 on the surface on the polarizer 16 side is positioned at −35° with respect to the extending direction of the ridge line R. In FIG. 12, the aspect in which the in-plane slow axis SY of the first optically anisotropic layer 24 on the surface on the polarizer 16 side is positioned at −35° with the extending direction of the ridge line R as a reference is shown, but the present embodiment is not limited to this aspect, and with the extending direction of the ridge line R as a reference, the in-plane slow axis SY of the first optically anisotropic layer 24 on the surface on the polarizer 16 side is positioned preferably within a range of −50° to −20° and more preferably within a range of −40° to −30°.

In addition, in FIG. 12, the twisted direction of the liquid crystal compound is counterclockwise.

That is, it is preferable that the organic EL display device 10 satisfies the following requirement A8.

Requirement A8: the in-plane slow axis of the first optically anisotropic layer on the surface on the organic EL display panel is positioned within a range of 35° to 65°, the in-plane slow axis of the first optically anisotropic layer on the surface on the polarizer side is positioned within a range of −50° to −20°, and the twisted direction of the liquid crystal compound is counterclockwise.

In addition, with satisfying the requirement A8, when observing the organic EL display device 10 from the polarizer 16 side, in a case where an absorption axis of the polarizer 16 is represented by a positive angle value in a clockwise direction and by a negative angle value in a counterclockwise direction with, as a reference, the extending direction of the ridge line R formed in a case where the organic EL display device is bent, the absorption axis of the polarizer 16 is positioned preferably within a range of 35° to 55° and more preferably within a range of 40° to 50°.

That is, it is preferable that the organic EL display device 10 satisfies the following requirement B8.

Requirement B8: the requirement A8 is satisfied, and the absorption axis of the polarizer is positioned within a range of 35° to 55°.

Method for manufacturing organic EL display device

The organic EL display device is not particularly limited as long as a known method is used.

Examples thereof include a method in which a composition for forming an optically anisotropic layer, containing a predetermined polymerizable liquid crystal compound, is applied onto a predetermined substrate to form a coating film, the coating film is subjected to an alignment treatment and then subjected to a curing treatment to form a predetermined optically anisotropic layer (first optically anisotropic layer to fourth optically anisotropic layer), the formed optically anisotropic layer and a polarizer are laminated through an adhesion layer to produce a circularly polarizing plate, and the produced circularly polarizing plate and an organic EL display panel is bonded.

In a case where the above-described composition for forming an optically anisotropic layer, the liquid crystal compound having a polymerizable group (hereinafter, also referred to as a "polymerizable liquid crystal compound"), contained in the composition for forming an optically anisotropic layer, is as described above, and an optimal polymerizable liquid crystal compound is appropriately selected according to the formation of each optically anisotropic layer (first optically anisotropic layer to fourth optically anisotropic layer).

A content of the polymerizable liquid crystal compound in the composition for forming an optically anisotropic layer is preferably 60% to 99% by mass and more preferably 70% to 98% by mass with respect to the total solid content of the composition for forming an optically anisotropic layer.

The solid content means a component capable of forming the optically anisotropic layer, excluding a solvent, and even in a case where a component itself is in a liquid state, such a component is regarded as the solid content.

The composition for forming an optically anisotropic layer may contain a compound other than the liquid crystal compound having a polymerizable group.

For example, in order to twist-align the liquid crystal compound, the composition for forming an optically anisotropic layer preferably contains a chiral agent. The chiral agent is added to twist-align the liquid crystal compound, but naturally, it is not necessary to add the chiral agent in a case where the liquid crystal compound is a compound exhibiting optical activity such as having an asymmetric carbon in a molecule thereof. In addition, it is not necessary to add the chiral agent, depending on the production method and the twisted angle.

The chiral agent is not particularly limited in a structure thereof as long as it is compatible with the liquid crystal compound used in combination. Any known chiral agent (for example, described in "Liquid Crystal Device Handbook" edited by the 142nd Committee of the Japan Society for the Promotion of Science, Chapter 3, 4-3, Chiral agents for TN and STN, p. 199, 1989) can be used.

An amount of the chiral agent used is not particularly limited, and is adjusted such that the above-described twisted angle is achieved.

The composition for forming an optically anisotropic layer may contain a polymerization initiator. The polymerization initiator used is selected according to the type of polymerization reaction, and examples thereof include a thermal polymerization initiator and a photopolymerization initiator.

A content of the polymerization initiator in the composition for forming an optically anisotropic layer is preferably 0.01% to 20% by mass and more preferably 0.5% to 10% by mass with respect to the total solid content of the composition for forming an optically anisotropic layer.

Examples of other components which may be contained in the composition for forming an optically anisotropic layer include a polyfunctional monomer, an alignment control agent (a vertical alignment agent and a horizontal alignment agent), a surfactant, an adhesion improver, a plasticizer, and a solvent, in addition to the above-described components.

Examples of the other components also include a photo-alignment compound (for example, a photo-alignment polymer).

The photo-alignment compound is a compound having a photo-aligned group, and the photo-aligned group can be aligned in a predetermined direction by irradiation with light.

Examples of a method of applying the composition for forming an optically anisotropic layer include a curtain coating method, a dip coating method, a spin coating method, a printing coating method, a spray coating method, a slot coating method, a roll coating method, a slide coating method, a blade coating method, a gravure coating method, and a wire bar method.

The alignment treatment can be performed by drying the coating film at room temperature or by heating the coating film. In a case of a thermotropic liquid crystal compound, a liquid crystal phase formed by the alignment treatment can generally be transferred by a change in temperature or pressure. In a case of a lyotropic liquid crystal compound, a liquid crystal phase formed by the alignment treatment can also be transferred by a compositional ratio such as an amount of solvent.

Conditions in a case of heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled as necessary, before a curing treatment (light irradiation treatment) described later.

A method of the curing treatment performed on the coating film in which the polymerizable liquid crystal compound is aligned is not particularly limited, and examples thereof include a light irradiation treatment and a heat treatment. Among these, from the viewpoint of production suitability, a light irradiation treatment is preferable, and an ultraviolet irradiation treatment is more preferable.

Irradiation conditions of the light irradiation treatment are not particularly limited, and an irradiation amount of 50 to 1,000 $mJ/cm^2$ is preferable.

The atmosphere during the light irradiation treatment is not particularly limited, but is preferably a nitrogen atmosphere.

In a case where another optically anisotropic layer is directly formed on the optically anisotropic layer, for example, the photo-alignment polymer is unevenly distributed on the surface of the optically anisotropic layer, and the photo-alignment polymer on the surface of the optically anisotropic layer may be aligned by irradiation with light to impart alignment restriction force.

Characteristics of organic EL display device

The organic EL display device 10 is bent at any suitable portion. For example, the display device may be bent at a central portion, such as a foldable display device, and from the viewpoint of designability and of maximizing a display screen, it may be bent at an end part. Needless to say, it is sufficient that a specifying portion of the organic EL display device 10 is bent (for example, a part or all of four corners in an oblique direction) depending on the intended use.

In addition, the organic EL display device 10 may be bent at one place or at two or more places as long as any of the requirements A1 to A8 is satisfied.

EXAMPLES

Hereinafter, features of the present invention will be described in more detail with reference to Examples and Comparative Examples. The materials, amounts used, proportions, treatment details, treatment procedure, and the like shown in the following Examples can be appropriately changed without departing from the spirit and scope of the present invention. Accordingly, the scope of the present invention should not be construed as being limited by the specific examples given below.

Example 1

Production of Cellulose Acylate Film (Substrate)

The following components were put into a mixing tank and stirred, and the obtained composition was further heated at 90° C. for 10 minutes. Thereafter, the obtained composition was filtered through a filter paper having an average pore diameter of 34 μm and a sintered metal filter having an average pore diameter of 10 μm to prepare a dope. The concentration of solid contents of the dope was 23.5% by mass, the amount of the plasticizer added was a proportion to cellulose acylate, and the solvent of the dope was methylene chloride/methanol/butanol=81/18/1 (mass ratio).

| Cellulose acylate dope | |
|---|---|
| Cellulose acylate (acetyl substitution degree: 2.86, viscosity average degree of polymerization: 310) | 100 parts by mass |
| Sugar ester compound 1 (represented by Chemical Formula (S4)) | 6.0 parts by mass |
| Sugar ester compound 2 (represented by Chemical Formula (S5)) | 2.0 parts by mass |
| Silica particle dispersion (AEROSIL R972, manufactured by Nippon Aerosil Co., Ltd.) | 0.1 parts by mass |

Solvent (methylene chloride/methanol/butanol)

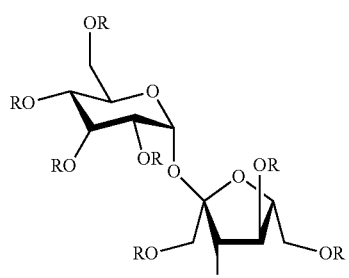

(54)

(R = benzoyl or H
Average substitution degree: 5.7)

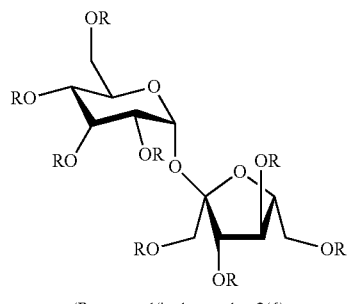

(55)

(R = acetyl/isobutyryl = 2/6)

The dope produced above was cast using a drum film forming machine. The dope was cast from a die such that it was in contact with a metal support cooled to 0° C., and then the obtained web (film) was stripped from the drum. The drum was made of SUS.

The web (film) obtained by casting was peeled off from the drum, and then dried in a tenter device for 20 minutes at 30° C. to 40° C. during film transport, using the tenter device that clipped and transported both ends of the web. Subsequently, the web was post-dried by zone heating while being rolled. The obtained web was knurled and then wound up.

In the obtained cellulose acylate film, a film thickness was 40 μm, an in-plane retardation Re(550) at a wavelength of 550 nm was 1 nm, and a thickness direction retardation Rth(550) at a wavelength of 550 nm was 26 nm.

Alkali Saponification Treatment

After passing the above-described cellulose acylate film through a dielectric heating roll at a temperature of 60° C. to raise the film surface temperature to 40° C., an alkaline solution having the composition shown below was applied onto a band surface of the film using a bar coater at a coating amount of 14 ml/m$^2$, followed by heating to 110° C., and transportation of the film under a steam type far-infrared heater manufactured by Noritake Company Limited for 10 seconds. Subsequently, pure water was applied onto the film at 3 ml/m$^2$ using the same bar coater. Next, the film was washed with water by a fountain coater and drained by an air knife three times, and then transported to a drying zone at 70° C. for 10 seconds and dried to produce a cellulose acylate film subjected to an alkali saponification treatment.

| Alkaline solution | |
|---|---|
| Potassium hydroxide | 4.7 parts by mass |
| Water | 15.8 parts by mass |
| Isopropanol | 63.7 parts by mass |
| Surfactant: $C_{14}H_{29}O(CH_2CH_2O)_{20}H$ | 1.0 parts by mass |
| Propylene glycol | 14.8 parts by mass |

Formation of Alignment Film Y1

An alignment film coating liquid having the following composition was continuously applied onto the surface of the cellulose acylate film which had been subjected to the alkali saponification treatment with a #14 wire bar. The obtained coating film was dried with hot air at 60° C. for 60 seconds, and further dried with hot air at 100° C. for 120 seconds to form an alignment film Y1.

| Alignment film coating liquid | |
|---|---|
| Polyvinyl alcohol shown below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Chemical Co., Ltd.) | 0.175 parts by mass |

Polyvinyl Alcohol

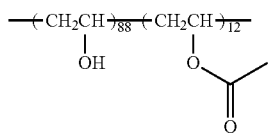

Formation of Optically Anisotropic Layer A

The alignment film Y1 produced above was continuously subjected to a rubbing treatment. In this case, the longitudinal direction and the transport direction of the long film were parallel to each other, and an angle between the longitudinal direction (transport direction) of the film and the rotation axis of the rubbing roller was 76°. In a case where the longitudinal direction (transport direction) of the film was defined as 90° and the clockwise direction was represented by a positive value with reference to a width direction of the film as a reference (0°) in a case of being observed from the film side, the rotation axis of the rubbing roller was −14°. In other words, the position of the rotation axis of the rubbing roller upon observation from the film side is a position rotated by 76° clockwise with reference to the longitudinal direction of the film.

A composition A for forming an optically anisotropic layer, containing a disk-like liquid crystal compound and having the following composition, was applied onto the rubbing-treated alignment film Y1 using a Geeser coating machine to form a composition layer. Next, the obtained composition layer was heated with hot air at 80° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer A.

A thickness of the optically anisotropic layer A was 1.4 µm. In addition, an in-plane retardation at a wavelength of 550 nm was 168 nm. It was confirmed that an average tilt angle of a disc plane of the disk-like liquid crystal compound with respect to the film surface was 90°, and the disk-like liquid crystal compound was aligned perpendicular to the film surface. In addition, in a case of viewing from the optically anisotropic layer A side, assuming that the in-plane slow axis angle of the optically anisotropic layer A was parallel to the rotation axis of the rubbing roller, and the width direction of the film was 0° (the counterclockwise direction was 90° and the clockwise direction was −90° in the longitudinal direction), the in-plane slow axis was −14°.

The optically anisotropic layer A corresponds to a negative A-plate (second optically anisotropic layer).

| Composition A for forming optically anisotropic layer | |
|---|---|
| Disk-like liquid crystal compound L-1 | 80 parts by mass |
| Disk-like liquid crystal compound L-2 | 20 parts by mass |
| Vertical alignment agent V-1 | 1.2 parts by mass |
| Fluorine-containing compound F-1 | 0.1 parts by mass |
| Fluorine-containing compound F-2 | 0.06 parts by mass |
| Fluorine-containing compound F-3 | 0.21 parts by mass |
| Ethylene oxide-modified trimethylolpropane triacrylate (V # 360, manufactured by Osaka Organic Chemical Industry Ltd.) | 5 parts by mass |
| Photopolymerization initiator S-1 | 4.0 parts by mass |
| Antifoaming agent B-1 | 2.0 parts by mass |
| Methyl ethyl ketone | 200 parts by mass |

Disk-like liquid crystal compound L-1

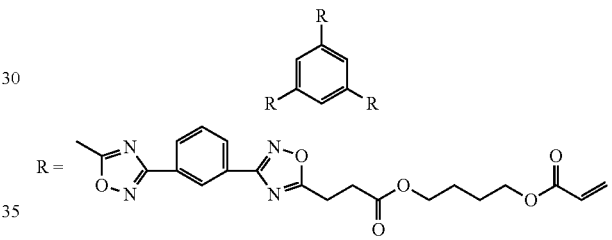

Disk-like liquid crystal compound L-2

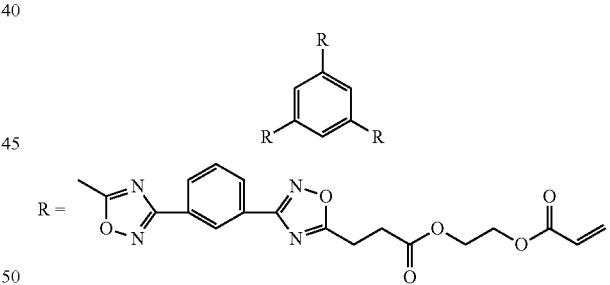

Vertical alignment agent V-1

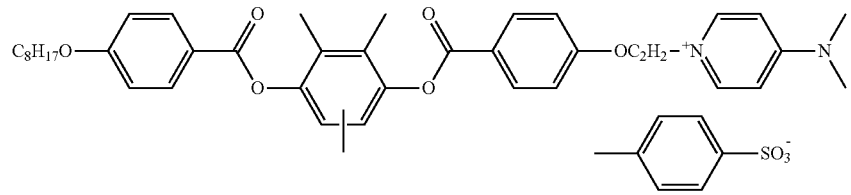

Fluorine-containing compound F-1 (in the formula, a and b represents a content (% by mass) of each repeating unit with respect to all repeating units, and a was 90% by mass and b was 10% by mass; in addition, a weight-average molecular weight was 15,000)

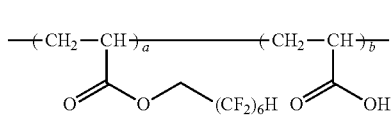

Fluorine-containing compound F-2 (numerical value in each repeating unit represents a content (% by mass) with respect to all repeating units; in addition, a weight-average molecular weight was 12,500)

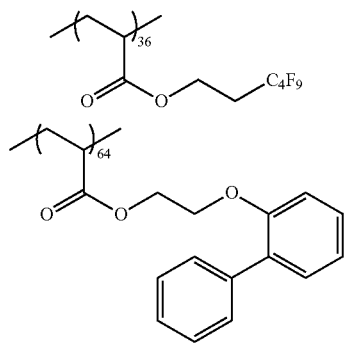

Fluorine-containing compound F-3 (numerical value in each repeating unit represents a content (% by mass) with respect to all repeating units; in addition, a weight-average molecular weight was 12,500)

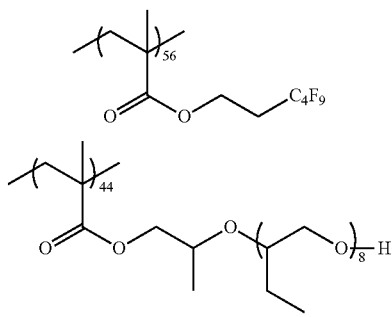

Photopolymerization initiator S-1

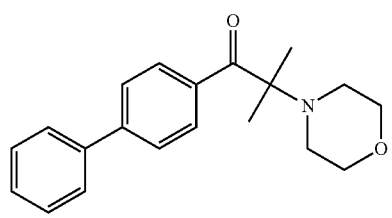 [SMILES: CC(C)(C(=O)c1ccc(-c2ccccc2)cc1)N1CCOCC1]

Antifoaming agent B-1

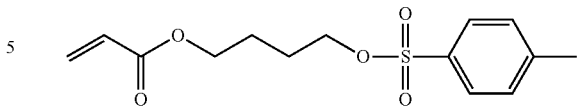

Formation of Laminate of Optically Anisotropic Layer C and Optically Anisotropic Layer B A composition C for forming an optically anisotropic layer, containing a rod-like liquid crystal compound and having the following composition, was applied onto the cellulose acylate film produced above using a Geeser coating machine to form a composition layer. Thereafter, both ends of the film were held, a cooling plate (9° C.) was installed on the side of the surface on which the composition layer of the film was formed so that the distance from the film was 5 mm, and a heater (75° C.) was installed on the side opposite to the surface on which the composition layer of the film was formed so that the distance from the film was 5 mm, followed by drying for 2 minutes.

Next, the film was heated with hot air at 60° C. for 1 minute, and irradiated with ultraviolet rays having an irradiation amount of 100 mJ/cm$^2$ using a 365 nm UV-LED while purging with nitrogen so as to have an atmosphere having an oxygen concentration of 100 ppm or less. Thereafter, the film was annealed with hot air at 120° C. for 1 minute to form an optically anisotropic layer C.

The obtained optically anisotropic layer C was irradiated with UV light (ultra-high pressure mercury lamp; UL750, manufactured by HOYA Corporation) passing through a wire grid polarizer at room temperature at 7.9 mJ/cm$^2$ (wavelength: 313 nm) to impart alignment control ability to the surface.

A film thickness of the formed optically anisotropic layer C was 0.7 The formed optically anisotropic layer C had an in-plane retardation Re of 0 nm at a wavelength of 550 nm and a thickness direction retardation Rth of −68 nm at a wavelength of 550 nm. It was confirmed that an average tilt angle of a major axis direction of the rod-like liquid crystal compound with respect to the film surface was 90° and the rod-like liquid crystal compound was aligned perpendicular to the film surface.

The optically anisotropic layer C corresponds to a positive C-plate (third optically anisotropic layer).

| Composition C for forming optically anisotropic layer | |
|---|---|
| Rod-like liquid crystal compound L-3 | 100 parts by mass |
| Polymerizable monomer (A-400, manufactured by Shin-Nakamura Chemical Co., Ltd.) | 4.2 parts by mass |
| Photopolymerization initiator S-2 (oxime type) | 5.1 parts by mass |
| Photoacid generator D-1 | 3.0 parts by mass |
| Polymer M-1 | 2.0 parts by mass |
| Vertical alignment agent V-2 | 1.9 parts by mass |
| Photo-alignment polymer P-1 | 0.8 parts by mass |
| Diisopropylethylamine | 0.2 parts by mass |
| Methyl ethyl ketone | 23.5 parts by mass |
| Ethyl propionate | 70.4 parts by mass |
| Methyl isobutyl ketone | 375.0 parts by mass |

Rod-like liquid crystal compound L-3 (mixture of compounds shown below)

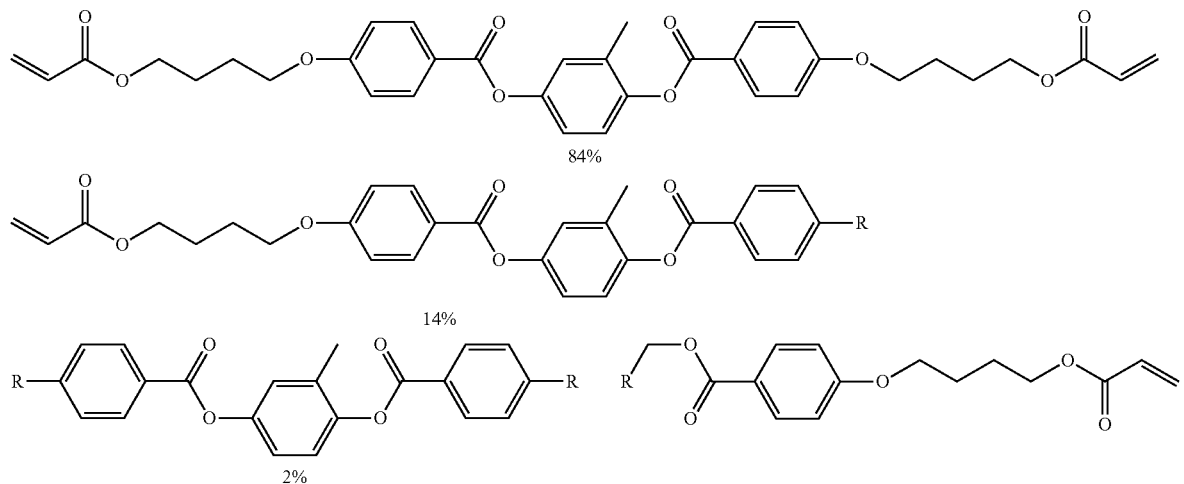
Photopolymerization initiator S-2
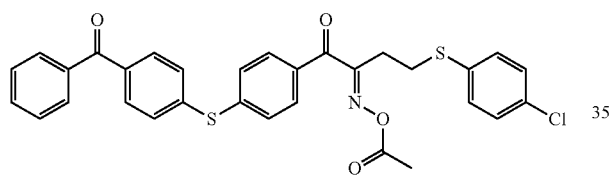
Photoacid generator D-1
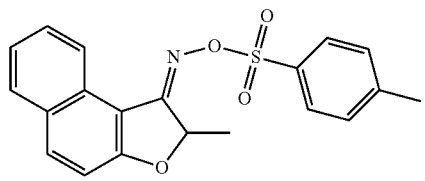 [SMILES: Cc1ccc(S(=O)(=O)O/N=C2/c3c(ccc4ccccc34)OC2C)cc1]
Polymer M-1 (numerical value in each repeating unit represents a content (% by mass) with respect to all repeating units; in addition, a weight-average molecular weight was 60,000)
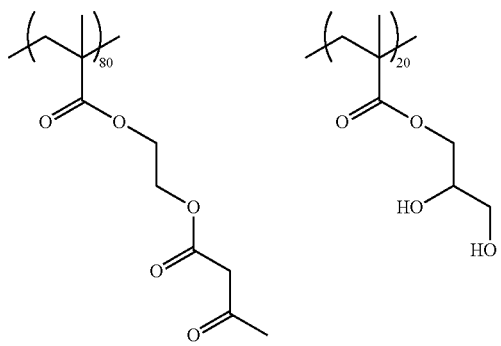
Vertical alignment agent V-2
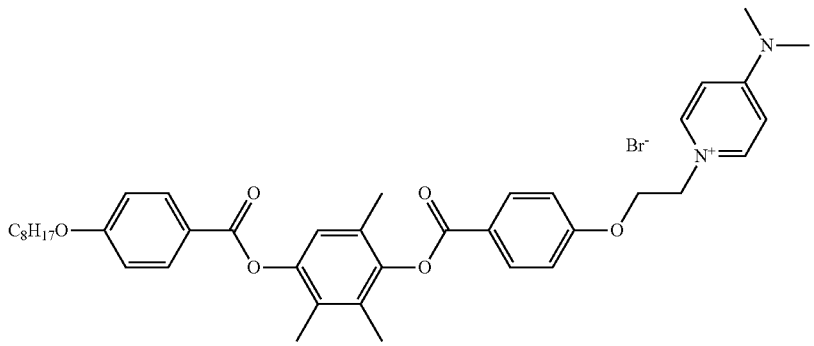

Photo-Alignment Polymer P-1 (numerical value described in each repeating unit represents a content (% by mass) of each repeating unit with respect to all repeating units; in addition, a weight-average molecular weight was 74,000)

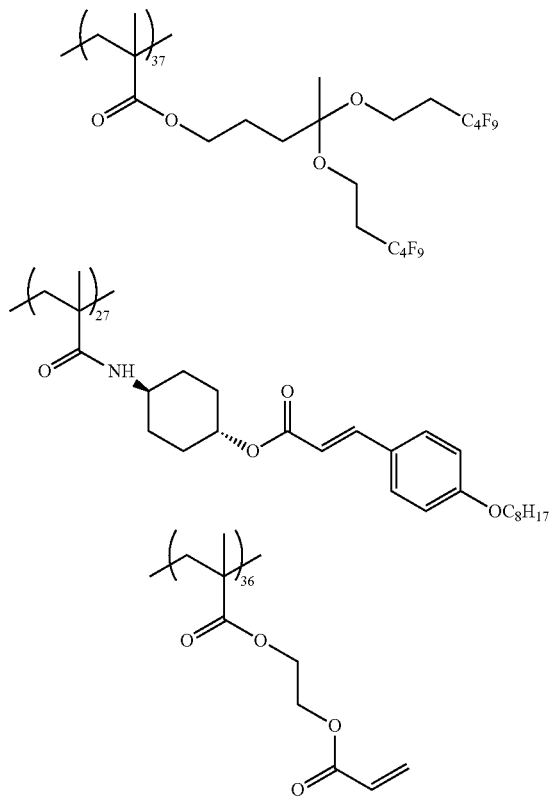

Next, a composition B for forming an optically anisotropic layer, containing a rod-like liquid crystal compound and having the following composition, was applied onto the optically anisotropic layer C produced above using a Geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer B.

In the optically anisotropic layer B, a thickness was 1.5 And at a wavelength of 550 nm was 164 nm, and a twisted angle of the liquid crystal compound was 81°. Assuming that the width direction of the film is defined as 0° (the longitudinal direction of the film is defined as 90°), a position of the in-plane slow axis (alignment axis angle of the liquid crystal compound) of the optically anisotropic layer B was 14° on the air side and 95° on the side in contact with the optically anisotropic layer C, in a case of viewing from the optically anisotropic layer B side.

The position of the in-plane slow axis of the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

In addition, the twisted angle of the liquid crystal compound is expressed as negative in a case where the alignment axis direction of the liquid crystal compound on the substrate side (back side) is clockwise (right-handed turning) and positive in a case where it is counterclockwise (left-handed turning) with reference to the alignment axis direction of the liquid crystal compound on the surface side (front side), upon observing the substrate from the surface side of the optically anisotropic layer.

The optically anisotropic layer B corresponds to the first optically anisotropic layer.

| Composition B for forming optically anisotropic layer | |
|---|---|
| Rod-like liquid crystal compound L-3 | 70 parts by mass |
| Rod-like liquid crystal compound L-4 | 30 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-handed twisting chiral agent C-1 | 0.48 parts by mass |
| Fluorine-containing compound F-4 | 0.20 parts by mass |
| Diisopropylethylamine | 0.70 parts by mass |
| Ethyl propionate | 126.5 parts by mass |
| Methyl isobutyl ketone | 126.5 parts by mass |

Rod-like liquid crystal compound L-4

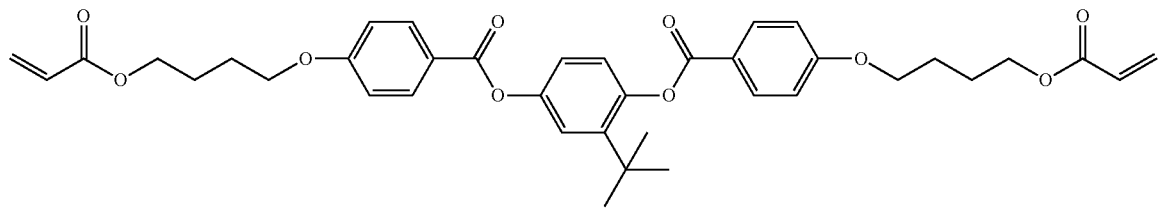 [SMILES: C=CC(=O)OCCCCOc1ccc(C(=O)Oc2ccc(OC(=O)c3ccc(OCCCCOC(=O)C=C)cc3)c(C(C)(C)C)c2)cc1]

Left-handed twisting chiral agent C-1

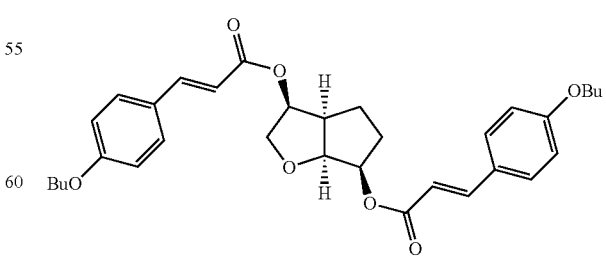

Fluorine-containing compound F-4 (numerical value in each repeating unit represents a content (% by mass) with respect to all the repeating units, in which the content of the repeating unit on the left side was 76% by mass and the content of the repeating unit on the right side was 24% by mass; in addition, a weight-average molecular weight was 27,300)

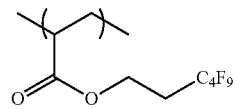

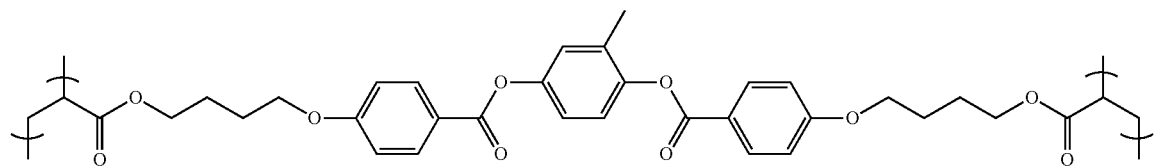

A laminate C-B in which the optically anisotropic layer C and the optically anisotropic layer B were directly laminated on the long cellulose acylate film was produced according to the above-described procedure. In a case where the surface of the optically anisotropic layer C on the side in contact with the optically anisotropic layer B was confirmed by the above-described method, it was confirmed that the photo-alignment polymer was present.

Formation of Retardation Layer A

As an UV-curable adhesive, an (active energy ray-curable adhesive composition for an adhesive layer (2b)) described in paragraph 0184 of JP2015-011094A was applied onto a surface side of the optically anisotropic layer A formed on the long cellulose acylate film, which was produced above, to form a coating film. Next, the optically anisotropic layer A on which the coating film had been disposed and the surface side of the optically anisotropic layer B in the laminate C-B formed on the long cellulose acylate film, which was produced above, were continuously bonded to each other such that an angle formed by the in-plane slow axis of the optically anisotropic layer A and the in-plane slow axis of the optically anisotropic layer B on the surface was 0°. Thereafter, from the bonded optically anisotropic layer C side, one surface was irradiated with ultraviolet rays (UV) of 800 mJ/cm² at 50° C., and then dried with hot air at 70° C. for 3 minutes to form an adhesion layer (thickness: 2 μm).

Next, the cellulose acylate film on the optically anisotropic layer A side and the alignment film Y1 were peeled off to expose the surface of the optically anisotropic layer A in contact with the cellulose acylate film. In this way, a retardation layer A in which the optically anisotropic layer C, the optically anisotropic layer B, and the optically anisotropic layer A were laminated on the long cellulose acylate film in this order was obtained. A thickness of the retardation layer A was 5.6

Production of Linearly Polarizing Plate 1

A surface of a support of a cellulose triacetate film TJ25 (manufactured by Fujifilm Corporation; thickness: 25 μm) was subjected to an alkali saponification treatment. Specifically, the support was immersed in a 1.5 N sodium hydroxide aqueous solution at 55° C. for 2 minutes, washed in a water bath at room temperature, and further neutralized with a 0.1 N sulfuric acid at 30° C. After neutralization, the support was washed in a water bath at room temperature and further dried with hot air at 100° C. to obtain a polarizer protective film.

A roll-like polyvinyl alcohol (PVA) film having a thickness of 60 μm was continuously stretched in an iodine aqueous solution in a longitudinal direction, and dried to obtain a polarizer having a thickness of 8 The luminosity corrected single transmittance of the polarizer was 43%. In this case, an absorption axis direction of the polarizer coincided with the longitudinal direction.

The above-described polarizer protective film was bonded to one surface of the above-described polarizer using the following PVA adhesive to produce a linearly polarizing plate 1.

Preparation of PVA Adhesive 100 parts by mass of a polyvinyl alcohol-based resin having an acetoacetyl group (average degree of polymerization: 1200, degree of saponification: 98.5 mol %, degree of acetoacetylation: 5 mol %) and 20 parts by mass of methylol melamine were dissolved in pure water under a temperature condition of 30° C. to prepare a PVA adhesive as an aqueous solution adjusted to a concentration of solid contents of 3.7% by mass.

Production of Circularly Polarizing Plate X1

As an UV-curable adhesive, an (active energy ray-curable adhesive composition for an adhesive layer (2b)) described in paragraph 0184 of JP2015-011094A was applied onto a surface (surface opposite to the polarizer protective film) side of the polarizer in the long linearly polarizing plate 1 produced above, to form a coating film. Next, the linearly polarizing plate 1 on which the coating film had been disposed and the surface side of the optically anisotropic layer A in the long retardation layer A produced above were continuously bonded to each other. Thereafter, from the bonded optically anisotropic layer C side, one surface was irradiated with ultraviolet rays (UV) of 800 mJ/cm² at 50° C., and then dried with hot air at 70° C. for 3 minutes to form an adhesion layer (thickness: 2 μm). Subsequently, the cellulose acylate film on the optically anisotropic layer C side was peeled off to expose the surface of the optically anisotropic layer C in contact with the cellulose acylate film.

In this way, a circularly polarizing plate X1 consisting of the retardation layer A and the polarizer was produced. In this case, the polarizer protective film, the polarizer, the optically anisotropic layer A, the optically anisotropic layer B, and the optically anisotropic layer C were laminated in this order, and an angle formed by the absorption axis of the polarizer and the slow axis of the optically anisotropic layer A was 76°. In addition, a position of the in-plane slow axis of the optically anisotropic layer B on the surface on the optically anisotropic layer A side was 14° with the width direction as a reference of 0°, which coincided with the slow axis direction of the optically anisotropic layer A. A thickness of the circularly polarizing plate X1 was 41

The position of the in-plane slow axis of the optically anisotropic layer B on the surface on the optically anisotropic layer A side is expressed as negative in a case where it is clockwise (right-handed turning) and positive in a case where it is counterclockwise (left-handed turning) with the width direction as a reference of 0°, upon observing the optically anisotropic layer B from the polarizer side.

Production of Substitute for Organic EL Display Device (Corresponding to Evaluation Sample)

A substitute for an organic EL display panel was produced as follows.

A polyethylene terephthalate (PET) film was bonded to polyimide with a pressure sensitive adhesive, and then the PET film and aluminum were bonded with a pressure sensitive adhesive so as to be adjacent to each other, thereby producing a substitute for an organic EL display panel, having a configuration of aluminum/PET film/polyimide. A thickness of the produced substitute for an organic EL display panel was 173

Thereafter, the circularly polarizing plate X1 produced above was bonded to the substitute for an organic EL display panel on the aluminum side through a pressure sensitive adhesive layer (thickness: 100 complex elastic modulus: 1.37×10$^5$ Pa) such that the polarizer protective film in the circularly polarizing plate was on the viewing side and the optically anisotropic layer C was on the substitute for an organic EL display panel side, thereby producing a substitute for an organic EL display device.

In the substitute for an organic EL display device produced above, with respect to an extending direction of a ridge line (hereinafter, also simply referred to as a "ridge line direction of the substitute for an organic EL display device) formed in a case where the substitute for an organic EL display device was bent, an absorption axis of the polarizer was positioned at 0°, an in-plane slow axis of the optically anisotropic layer B on the surface on the optically anisotropic layer A side was positioned at 76°, and an in-plane slow axis of the optically anisotropic layer B on the surface on the optically anisotropic layer C was positioned at −5°. Positions of the absorption axis of the polarizer and the in-plane slow axis of the liquid crystal compound are expressed as positive in a case where it is clockwise (right-handed turning) and negative in a case where it is counterclockwise (left-handed turning) with the ridge line direction as a reference of 0°, upon observing the substitute for an organic EL display device from the surface side of the polarizer protective film.

Examples 2 to 4 and Comparative Example 1

Substitutes for an organic EL display device were produced in the same procedure as in Example 1, except that, with respect to the ridge line direction of the substitute for an organic EL display device, the position of the absorption axis of the polarizer, the position of the optically anisotropic layer B on the surface on the optically anisotropic layer A, and the position of the optically anisotropic layer B on the surface on the optically anisotropic layer C side were changed to values listed in Table 1, and the position of the in-plane slow axis of the optically anisotropic layer A was changed such that the angle formed by the in-plane slow axis of the optically anisotropic layer A and the in-plane slow axis of the optically anisotropic layer B on the surface on the optically anisotropic layer A side was the same as that of Example 1. In addition, various evaluations were performed.

Example 5

Formation of Optically Anisotropic Layer B

The alignment film Y1 produced above was continuously subjected to a rubbing treatment. In this case, the longitudinal direction and the transport direction of the long film were parallel to each other, and an angle between the longitudinal direction (transport direction) of the film and the rotation axis of the rubbing roller was 5°. In a case where the longitudinal direction (transport direction) of the film was defined as 90° and the clockwise direction was represented by a positive value with reference to a width direction of the film as a reference (0°) in a case of being observed from the film side, the rotation axis of the rubbing roller was 5°. In other words, the position of the rotation axis of the rubbing roller upon observation from the film side is a position rotated by 95° clockwise with reference to the longitudinal direction of the film.

Next, the composition B for forming an optically anisotropic layer, containing a rod-like liquid crystal compound and having the above-described composition, was applied onto the rubbing-treated alignment film Y1 using a Geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer B.

In the optically anisotropic layer B, a thickness was 1.5 μm, Δnd at a wavelength of 550 nm was 164 nm, and a twisted angle of the liquid crystal compound was 81°. Assuming that the width direction of the film is defined as 0° (the longitudinal direction of the film is defined as 90°), a position of the in-plane slow axis (alignment axis angle of the liquid crystal compound) of the optically anisotropic layer B was 14° on the air side and 95° on the side in contact with the alignment film, in a case of viewing from the air interface side.

The position of the in-plane slow axis of the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

In addition, the twisted angle of the liquid crystal compound is expressed as negative in a case where the alignment axis direction of the liquid crystal compound on the substrate side (back side) is clockwise (right-handed turning) and positive in a case where it is counterclockwise (left-handed turning) with reference to the alignment axis direction of the liquid crystal compound on the surface side (front side), upon observing the substrate from the surface side of the optically anisotropic layer.

Formation of Retardation Layer B

As an UV-curable adhesive, an (active energy ray-curable adhesive composition for an adhesive layer (2b)) described in paragraph 0184 of JP2015-011094A was applied onto a surface side of the optically anisotropic layer A formed on the long cellulose acylate film, which was produced above, to form a coating film. Next, the optically anisotropic layer A on which the coating film had been disposed and the surface side of the optically anisotropic layer B formed on the long cellulose acylate film produced above were continuously bonded to each other.

Thereafter, from the bonded optically anisotropic layer B side, one surface was irradiated with ultraviolet rays (UV) of 800 mJ/cm² at 50° C., and then dried with hot air at 70° C. for 3 minutes to form an adhesion layer (thickness: 2 μm).

Next, the cellulose acylate film on the optically anisotropic layer A side and the alignment film Y1 were peeled off to expose the surface of the optically anisotropic layer A in contact with the cellulose acylate film. In this way, a retardation layer B in which the optically anisotropic layer B and the optically anisotropic layer A were laminated on the long cellulose acylate film in this order was obtained. A thickness of the retardation layer B was 4.9

Production of Circularly Polarizing Plate X2

As an UV-curable adhesive, an (active energy ray-curable adhesive composition for an adhesive layer (2b)) described in paragraph 0184 of JP2015-011094A was applied onto a surface (surface opposite to the polarizer protective film) side of the polarizer in the long linearly polarizing plate 1 produced above, to form a coating film. Next, the linearly polarizing plate 1 on which the coating film had been disposed and the surface side of the optically anisotropic layer B in the long retardation layer A produced above were continuously bonded to each other. Thereafter, from the bonded optically anisotropic layer B side, one surface was irradiated with ultraviolet rays (UV) of 800 mJ/cm² at 50° C., and then dried with hot air at 70° C. for 3 minutes to form an adhesion layer (thickness: 2 μm). Next, the cellulose acylate film on the optically anisotropic layer B side and the alignment film Y1 were peeled off to expose the surface of the optically anisotropic layer B in contact with the cellulose acylate film.

In this way, a circularly polarizing plate X2 consisting of the retardation layer B and the polarizer was produced. In this case, the polarizer protective film, the polarizer, the optically anisotropic layer A, and the optically anisotropic layer B were laminated in this order, and an angle formed by the absorption axis of the polarizer and the slow axis of the optically anisotropic layer A was 76°. In addition, the in-plane slow axis of the optically anisotropic layer B on the surface on the optically anisotropic layer A side was positioned at 14° with the width direction as a reference of 0°, which coincided with the slow axis direction of the optically anisotropic layer A.

A thickness of the circularly polarizing plate X2 was 40 μm.

The position of the in-plane slow axis of the optically anisotropic layer B on the surface on the optically anisotropic layer A side is expressed as negative in a case where it is clockwise (right-handed turning) and positive in a case where it is counterclockwise (left-handed turning) with the width direction as a reference of 0°, upon observing the optically anisotropic layer B from the polarizer side.

Production of Substitute for Organic EL Display Device (Corresponding to Evaluation Sample)

The circularly polarizing plate X2 produced above was bonded to the substitute for an organic EL display panel, produced above, on the aluminum side through a pressure sensitive adhesive layer (thickness: 100 μm, complex elastic modulus: 1.37×10⁵ Pa) such that the polarizer protective film in the circularly polarizing plate was on the viewing side and the optically anisotropic layer B was on the substitute for an organic EL display panel side, thereby producing a substitute for an organic EL display device. In addition, various evaluations were performed.

In the substitute for an organic EL display device produced above, with respect to the ridge line direction of the substitute for an organic EL display device, an absorption axis of the polarizer was positioned at 0°, an in-plane slow axis of the optically anisotropic layer B on the surface on the optically anisotropic layer A side was positioned at 76°, and an in-plane slow axis of the optically anisotropic layer B on a surface opposite to the optically anisotropic layer A was positioned at −5°. Positions of the absorption axis of the polarizer and the in-plane slow axis are expressed as positive in a case where it is clockwise (right-handed turning) and negative in a case where it is counterclockwise (left-handed turning) with the ridge line direction as a reference of 0°, upon observing the substrate from the surface side of the polarizer protective film.

Example 6

Formation of Laminate of Optically Anisotropic Layer E and Optically Anisotropic Layer D A composition E for forming an optically anisotropic layer, containing a rod-like liquid crystal compound and having the following composition, was applied onto the cellulose acylate film produced above using a Geeser coating machine to form a composition layer. The film on which the composition layer had been formed was heated with hot air at 116° C. for 1 minute, and irradiated with ultraviolet rays having an irradiation amount of 150 mJ/cm² at 78° C. using a 365 nm UV-LED while purging with nitrogen so as to have an atmosphere having an oxygen concentration of 100 ppm by mass or less. Thereafter, the obtained coating film was annealed with hot air at 115° C. for 25 seconds to form an optically anisotropic layer E.

The obtained optically anisotropic layer E was irradiated with UV light (ultra-high pressure mercury lamp; UL750, manufactured by HOYA Corporation) passing through a wire grid polarizer at room temperature at 7.9 mJ/cm² (wavelength: 313 nm) to impart alignment control ability to the surface.

A film thickness of the formed optically anisotropic layer E was 0.6 μm. The formed optically anisotropic layer E had an in-plane retardation Re of 0 nm at a wavelength of 550 nm and a thickness direction retardation Rth of −35 nm at a wavelength of 550 nm. It was confirmed that an average tilt angle of a disc plane of the disk-like liquid crystal compound with respect to the film surface was 0°, and the disk-like liquid crystal compound was horizontally aligned with respect to the film surface.

The optically anisotropic layer E corresponds to a negative C-plate (fourth optically anisotropic layer).

| Composition E for forming optically anisotropic layer | |
|---|---|
| Disk-like liquid crystal compound L-1 | 4 parts by mass |
| Disk-like liquid crystal compound L-2 | 1 part by mass |
| Disk-like liquid crystal compound L-5 | 95.0 parts by mass |
| Ethylene oxide-modified trimethylolpropane triacrylate (V # 360, manufactured by Osaka Organic Chemical Industry Ltd.) | 12.0 parts by mass |
| Photopolymerization initiator S-2 (oxime type) | 3.0 parts by mass |
| Photoacid generator D-1 | 3.0 parts by mass |
| Photo-alignment polymer P-2 | 0.6 parts by mass |
| Diisopropylethylamine | 0.2 parts by mass |
| o-xylene | 475 parts by mass |

Disk-like liquid crystal compound L-5

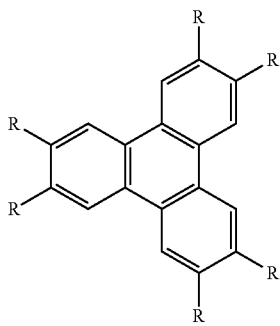

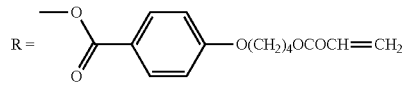

Photo-alignment polymer P-2 (alphabet described in each repeating unit represents a content (% by mass) of each repeating unit with respect to all repeating units, in which a was 53% by mass and b was 47% by mass; in addition, a weight-average molecular weight was 183,000)

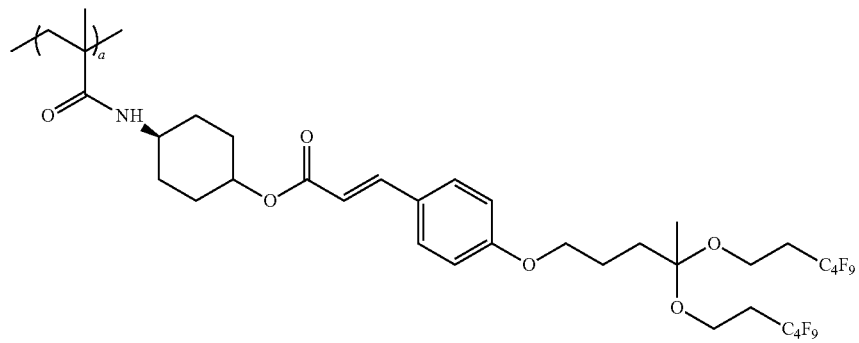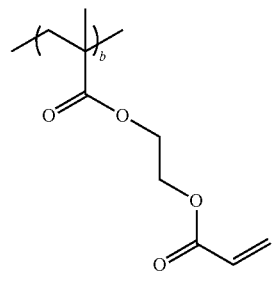

| Composition D for forming optically anisotropic layer | |
|---|---|
| Disk-like liquid crystal compound L-1 | 80 parts by mass |
| Disk-like liquid crystal compound L-2 | 20 parts by mass |
| Vertical alignment agent V-1 | 1.8 parts by mass |
| Fluorine-containing compound F-1 | 0.1 parts by mass |
| Fluorine-containing compound F-2 | 0.06 parts by mass |
| Fluorine-containing compound F-3 | 0.21 parts by mass |
| Ethylene oxide-modified trimethylolpropane triacrylate (V # 360, manufactured by Osaka Organic Chemical Industry Ltd.) | 10 parts by mass |
| Photopolymerization initiator S-2 (oxime type) | 5.0 parts by mass |
| Antifoaming agent B-1 | 2.1 parts by mass |
| Methyl ethyl ketone | 200 parts by mass |

A laminate E-D in which the optically anisotropic layer E and the optically anisotropic layer D were directly laminated on the long cellulose acylate film was produced according to the above-described procedure. In a case where the surface of the optically anisotropic layer E on the side in contact with the optically anisotropic layer D was confirmed by the above-described method, it was confirmed that the photo-alignment polymer was present.

Formation of Laminate of Optically Anisotropic Layer C2 and Optically Anisotropic Layer B2

Next, a composition D for forming an optically anisotropic layer, containing a disk-like liquid crystal compound and having the following composition, was applied onto the optically anisotropic layer E produced above using a Geeser coating machine to form a composition layer.

Next, the obtained composition layer was heated with hot air at 95° C. for 2 minutes for drying of the solvent and alignment aging of the disk-like liquid crystal compound. Subsequently, the obtained composition layer was irradiated with UV (100 mJ/cm²) at 95° C. to immobilize the alignment of the liquid crystal compound to form an optically anisotropic layer D.

A thickness of the optically anisotropic layer D was 1.3 µm. In addition, an in-plane retardation at a wavelength of 550 nm was 160 nm. It was confirmed that an average tilt angle of a disc plane of the disk-like liquid crystal compound with respect to the film surface was 90°, and the disk-like liquid crystal compound was aligned perpendicular to the film surface. In addition, in a case of viewing from the optically anisotropic layer D side, assuming that the width direction of the film was 0° (the counterclockwise direction was 90° and the clockwise direction was −90° in the longitudinal direction), the in-plane slow axis angle of the optically anisotropic layer D was −14°.

The optically anisotropic layer D corresponds to a negative A-plate (second optically anisotropic layer).

An optically anisotropic layer C2 was produced according to the same procedure as in Example 1, except that the film thickness of the optically anisotropic layer C was changed from 0.7 µm to 0.9 µm, and the thickness direction retardation Rth at a wavelength of 550 nm was changed from −68 nm to −89 nm.

An optically anisotropic layer B2 was produced on the optically anisotropic layer C2 according to the same procedure as in Example 1, except that Δnd of the optically anisotropic layer B at a wavelength of 550 nm was changed from 164 nm to 173 nm, and the twisted angle of the liquid crystal compound was changed from 81° to 84.5° (assuming that the width direction of the film is defined as 0° (the longitudinal direction of the film is defined as 90°), in a case of viewing from the optically anisotropic layer B2 side, the in-plane slow axis was positioned at 10.5° on the air-side surface and positioned at 95° on the surface in contact with the optically anisotropic layer C2).

A laminate C2-B2 in which the optically anisotropic layer C2 and the optically anisotropic layer B2 were directly laminated on the long cellulose acylate film was produced according to the above-described procedure. In a case where the surface of the optically anisotropic layer C2 on the side in contact with the optically anisotropic layer B2 was confirmed by the above-described method, it was confirmed that the photo-alignment polymer was present.

Formation of Retardation Layer C

As an UV-curable adhesive, an (active energy ray-curable adhesive composition for an adhesive layer (2b)) described in paragraph 0184 of JP2015-011094A was applied onto a surface side of the optically anisotropic layer D in the laminate E-D formed on the long cellulose acylate film, which was produced above, to form a coating film. Next, the laminate E-D on which the coating film had been disposed and the surface side of the optically anisotropic layer B2 in the laminate C2-B2, formed on the long cellulose acylate film produced above, were continuously bonded to each other. Thereafter, from the bonded optically anisotropic layer C2 side, one surface was irradiated with ultraviolet rays (UV) of 800 mJ/cm$^2$ at 50° C., and then dried with hot air at 70° C. for 3 minutes to form an adhesion layer (thickness: 2 μm).

Subsequently, the cellulose acylate film on the optically anisotropic layer E side was peeled off to expose the surface of the optically anisotropic layer E in contact with the cellulose acylate film. In this way, a retardation layer C in which the optically anisotropic layer C2, the optically anisotropic layer B2, the optically anisotropic layer D, and the optically anisotropic layer E were laminated on the long cellulose acylate film in this order was obtained. A thickness of the retardation layer C was 6.3

Production of Circularly Polarizing Plate X3

As an UV-curable adhesive, an (active energy ray-curable adhesive composition for an adhesive layer (2b)) described in paragraph 0184 of JP2015-011094A was applied onto a surface (surface opposite to the polarizer protective film) side of the polarizer in the long linearly polarizing plate 1 produced above, to form a coating film. Next, the linearly polarizing plate 1 on which the coating film had been disposed and the surface side of the optically anisotropic layer E in the long retardation layer C produced above were continuously bonded to each other. Thereafter, from the bonded optically anisotropic layer C2 side, one surface was irradiated with ultraviolet rays (UV) of 800 mJ/cm$^2$ at 50° C., and then dried with hot air at 70° C. for 3 minutes to form an adhesion layer (thickness: 2 μm). Subsequently, the cellulose acylate film on the optically anisotropic layer C2 side was peeled off to expose the surface of the optically anisotropic layer C2 in contact with the cellulose acylate film.

In this way, a circularly polarizing plate X3 consisting of the retardation layer C and the polarizer was produced. In this case, the polarizer protective film, the polarizer, the optically anisotropic layer E, the optically anisotropic layer D, the optically anisotropic layer B2, and the optically anisotropic layer C2 were laminated in this order, and an angle formed by the absorption axis of the polarizer and the slow axis of the optically anisotropic layer D was 76°. In addition, the in-plane slow axis of the optically anisotropic layer B2 on the surface on the optically anisotropic layer D side was positioned at 10.5° with the width direction as a reference of 0°. A thickness of the circularly polarizing plate X3 was 41

The position of the in-plane slow axis of the optically anisotropic layer B2 on the surface on the optically anisotropic layer D side is expressed as negative in a case where it is clockwise (right-handed turning) and positive in a case where it is counterclockwise (left-handed turning) with the width direction as a reference of 0°, upon observing the optically anisotropic layer B2 from the polarizer side.

Production of Substitute for Organic EL Display Device (Corresponding to Evaluation Sample)

The circularly polarizing plate X3 produced above was bonded to the substitute for an organic EL display panel, produced above, on the aluminum side through a pressure sensitive adhesive layer (thickness: 100 μm, complex elastic modulus: 1.37×10$^5$ Pa) such that the polarizer protective film in the circularly polarizing plate was on the viewing side and the optically anisotropic layer C2 was on the substitute for an organic EL display panel side, thereby producing a substitute for an organic EL display device. In addition, various evaluations were performed.

In the substitute for an organic EL display device produced above, with respect to the ridge line direction of the substitute for an organic EL display device, an absorption axis of the polarizer was positioned at 0°, an in-plane slow axis of the optically anisotropic layer B2 on the surface on the optically anisotropic layer E side was positioned at 79.5°, and an in-plane slow axis of the optically anisotropic layer B2 on the surface on the optically anisotropic layer C was positioned at −5°. Positions of the absorption axis of the polarizer and the in-plane slow axis are expressed as positive in a case where it is clockwise (right-handed turning) and negative in a case where it is counterclockwise (left-handed turning) with the ridge line direction as a reference of 0°, upon observing the substrate from the surface side of the polarizer protective film.

Comparative Example 2

A substitute for an organic EL display device was produced according to the same procedure as in Example 6, except that, with respect to the ridge line direction of the substitute for an organic EL display device, the direction of the absorption axis of the polarizer was changed from 0° to 25°, the in-plane slow axis of the optically anisotropic layer B on the surface on the optically anisotropic layer A side was from 79.5° to 104.5°, and the in-plane slow axis of the optically anisotropic layer B on the surface on the optically anisotropic layer C side was changed from −5° to 20°. In addition, various evaluations were performed.

Comparative Example 3

Formation of Alignment Film Y2

After passing a long cellulose acylate film (TD80UL, manufactured by Fujifilm Corporation) through a dielectric heating roll at a temperature of 60° C. to raise the film surface temperature to 40° C., the above-described alkaline solution was applied onto a band surface of the film using a bar coater at a coating amount of 14 ml/m$^2$, followed by heating to 110° C., and transportation under a steam type far-infrared heater manufactured by Noritake Company Limited for 10 seconds. Subsequently, pure water was applied onto the film at 3 ml/m$^2$ using the same bar coater. Next, the film was washed with water by a fountain coater and drained by an air knife three times, and then transported to a drying zone at 70° C. for 10 seconds and dried to produce a cellulose acylate film (thickness: 80 μm) subjected to an alkali saponification treatment.

The above-described alignment film coating liquid was continuously applied onto the surface of the cellulose acylate film which had been subjected to the alkali saponification treatment with a #14 wire bar. Next, the coating film was dried with hot air at 60° C. for 60 seconds, and further dried with hot air at 100° C. for 120 seconds to produce an alignment film Y2.

Formation of Optically Anisotropic Layer F

The alignment film Y2 produced above was continuously subjected to a rubbing treatment. In this case, the longitudinal direction and the transport direction of the long film were parallel to each other, and an angle between the longitudinal direction of the film and the rotation axis of the rubbing roller was 72.5°. In a case where the longitudinal direction (transport direction) of the film was defined as 90° and the clockwise direction was represented by a positive value with reference to a width direction of the film as a reference (0°) in a case of being observed from the film side, the rotation axis of the rubbing roller was −17.5°. In other words, the position of the rotation axis of the rubbing roller upon observation from the film side is a position rotated by 72.5° clockwise with reference to the longitudinal direction of the film.

A composition F for forming an optically anisotropic layer, containing a disk-like liquid crystal compound and having the following composition, was applied onto the rubbing-treated alignment film Y2 using a Geeser coating machine to form a composition layer. Next, the obtained composition layer was heated with hot air at 130° C. for 90 seconds and then with hot air at 100° C. for 60 seconds for drying of the solvent and alignment aging of the disk-like liquid crystal compound. Subsequently, the obtained composition layer was irradiated with UV (300 mJ/cm$^2$) at 80° C. to immobilize the alignment of the liquid crystal compound to form an optically anisotropic layer F.

A thickness of the optically anisotropic layer F was 2.0 μm. In addition, an in-plane retardation at a wavelength of 550 nm was 236 nm. It was confirmed that an average tilt angle of a disc plane of the disk-like liquid crystal compound with respect to the film surface was 90°, and the disk-like liquid crystal compound was aligned perpendicular to the film surface. In addition, in a case of viewing from the optically anisotropic layer F side, assuming that the in-plane slow axis angle of the optically anisotropic layer F was parallel to the rotation axis of the rubbing roller, and the width direction of the film was 0° (the counterclockwise direction was 90° and the clockwise direction was −90° in the longitudinal direction), the in-plane slow axis was −17.5°.

| Composition F for forming optically anisotropic layer | |
|---|---|
| Disk-like liquid crystal compound L-1 | 80 parts by mass |
| Disk-like liquid crystal compound L-2 | 20 parts by mass |
| Alignment film interface alignment agent-1 | 2 parts by mass |
| Fluorine-containing compound F-1 | 0.1 parts by mass |
| Fluorine-containing compound F-5 | 0.2 parts by mass |
| Fluorine-containing compound F-6 | 0.05 parts by mass |
| Ethylene oxide-modified trimethylolpropane triacrylate (V # 360, manufactured by Osaka Organic Chemical Industry Ltd.) | 5 parts by mass |
| Photopolymerization initiator (Irgacure 907, manufactured by BASF SE) | 4 parts by mass |
| Methyl ethyl ketone | 200 parts by mass |

Fluorine-containing compound F-5 (numerical value in each repeating unit represents a content (% by mass) with respect to all repeating units; in addition, a weight-average molecular weight was 12,800)

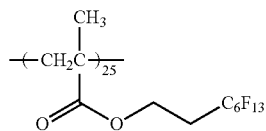

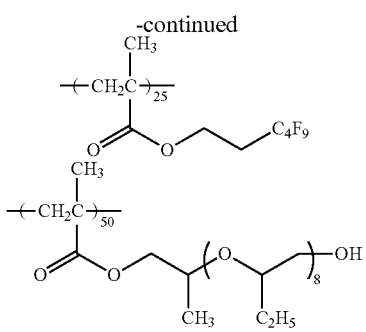

Fluorine-containing compound F-6 (numerical value in each repeating unit represents a content (% by mass) with respect to all repeating units; in addition, a weight-average molecular weight was 12,500)

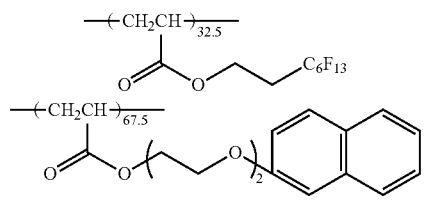

Formation of Optically Anisotropic Layer G

The alignment film Y2 produced above was continuously subjected to a rubbing treatment. In this case, the longitudinal direction and the transport direction of the long film were parallel to each other, and an angle between the longitudinal direction of the film and the rotation axis of the rubbing roller was 77.5°. In a case where the longitudinal direction (transport direction) of the film was defined as 90° and the clockwise direction was represented by a positive value with reference to a width direction of the film as a reference (0°) in a case of being observed from the film side, the rotation axis of the rubbing roller was −12.5°. In other words, the position of the rotation axis of the rubbing roller upon observation from the film side is a position rotated by 77.5° clockwise with reference to the longitudinal direction of the film.

A composition G for forming an optically anisotropic layer, containing a rod-like liquid crystal compound and having the following composition, was applied onto the rubbing-treated alignment film Y2 using a Geeser coating machine to form a composition layer. Next, the obtained composition layer was heated with hot air at 60° C. for 60 seconds for drying of the solvent and alignment aging of the rod-like liquid crystal compound. Subsequently, the obtained composition layer was irradiated with UV (300 mJ/cm$^2$) at 60° C. to immobilize the alignment of the liquid crystal compound to form an optically anisotropic layer G.

A thickness of the optically anisotropic layer G was 1.1 In addition, an in-plane retardation at a wavelength of 550 nm was 116 nm. It was confirmed that an average tilt angle of a major axis of the rod-like liquid crystal compound with respect to the film surface was 0°, and the rod-like liquid crystal compound was horizontally aligned with respect to the film surface. In addition, in a case of viewing from the optically anisotropic layer G side, assuming that the in-plane slow axis angle of the optically anisotropic layer G was orthogonal to the rotation axis of the rubbing roller, and the width direction of the film was 0° (the counterclockwise direction was 90° and the clockwise direction was −90° in the longitudinal direction), the in-plane slow axis was 77.5°.

| Composition G for forming optically anisotropic layer | |
|---|---|
| Rod-like liquid crystal compound L-3 | 100 parts by mass |
| Photopolymerization initiator (Irgacure 907, manufactured by BASF SE) | 6 parts by mass |
| Fluorine-containing compound F-5 | 0.25 parts by mass |
| Fluorine-containing compound F-6 | 0.3 parts by mass |
| Ethylene oxide-modified trimethylolpropane triacrylate (V # 360, manufactured by Osaka Organic Chemical Industry Ltd.) | 8 parts by mass |
| Methyl ethyl ketone | 337 parts by mass |

Formation of Retardation Layer D

As an UV-curable adhesive, an (active energy ray-curable adhesive composition for an adhesive layer (2b)) described in paragraph 0184 of JP2015-011094A was applied onto a surface side of the optically anisotropic layer F formed on the long cellulose acylate film, which was produced above, to form a coating film. Next, the optically anisotropic layer F on which the coating film had been disposed and the surface side of the optically anisotropic layer G formed on the long cellulose acylate film produced above were continuously bonded to each other.

Thereafter, from the bonded optically anisotropic layer G side, one surface was irradiated with ultraviolet rays (UV) of 800 mJ/cm² at 50° C., and then dried with hot air at 70° C. for 3 minutes to form an adhesion layer (thickness: 2 μm).

Next, the cellulose acylate film on the optically anisotropic layer F side and the alignment film Y2 were peeled off to expose the surface of the optically anisotropic layer F in contact with the cellulose acylate film. In this way, a retardation layer D in which the optically anisotropic layer G and the optically anisotropic layer F were laminated on the long cellulose acylate film in this order was obtained. A thickness of the retardation layer D was 5.1

Production of Circularly Polarizing Plate X4

As an UV-curable adhesive, an (active energy ray-curable adhesive composition for an adhesive layer (2b)) described in paragraph 0184 of JP2015-011094A was applied onto a surface (surface opposite to the polarizer protective film) side of the polarizer in the long linearly polarizing plate 1 produced above, to form a coating film. Next, the linearly polarizing plate 1 on which the coating film had been disposed and the surface side of the optically anisotropic layer F in the long retardation layer D produced above were continuously bonded to each other. Thereafter, from the bonded optically anisotropic layer G side, one surface was irradiated with ultraviolet rays (UV) of 800 mJ/cm² at 50° C., and then dried with hot air at 70° C. for 3 minutes to form an adhesion layer (thickness: 2 μm). Next, the cellulose acylate film on the optically anisotropic layer G side and the alignment film Y2 were peeled off to expose the surface of the optically anisotropic layer G in contact with the cellulose acylate film.

In this way, a circularly polarizing plate X4 consisting of the retardation layer D and the polarizer was produced. In this case, the polarizer protective film, the polarizer, the optically anisotropic layer F, and the optically anisotropic layer G were laminated in this order, and an angle formed by the absorption axis of the polarizer and the in-plane slow axis of the optically anisotropic layer F was 72.5°. A thickness of the circularly polarizing plate X4 was 40 μm.

Production of Substitute for Organic EL Display Device (Corresponding to Evaluation Sample)

The circularly polarizing plate X4 produced above was bonded to the substitute for an organic EL display panel, produced above, on the aluminum side through a pressure sensitive adhesive layer (thickness: 100 μm, complex elastic modulus: $1.37 \times 10^5$ Pa) such that the polarizer protective film in the circularly polarizing plate was on the viewing side and the optically anisotropic layer G was on the substitute for an organic EL display panel side, thereby producing a substitute for an organic EL display device. In addition, various evaluations were performed.

In the substitute for an organic EL display device produced above, with respect to the ridge line direction of the substitute for an organic EL display device, the absorption axis of the polarizer was 0°. A position of the absorption axis of the polarizer is expressed as positive in a case where it is clockwise (right-handed turning) and negative in a case where it is counterclockwise (left-handed turning) with the ridge line direction as a reference of 0°, upon observing the substrate from the surface side of the polarizer protective film.

Comparative Example 4

A substitute for an organic EL display device was produced according to the same procedure as in Comparative Example 3, except that, with respect to the ridge line direction of the substitute for an organic EL display device, the direction of the absorption axis of the polarizer was changed from 0° to 45°. In addition, various evaluations were performed.

Comparative Example 5

Formation of optically anisotropic layer H An optically anisotropic layer H was produced according to the same procedure as in Comparative Example 3, except that the thickness of the optically anisotropic layer G was changed from 1.1 μm to 2.0 μm, and the in-plane retardation at a wavelength of 550 nm was changed from 116 nm to 236 nm.

Formation of Retardation Layer E

A retardation layer E in which the optically anisotropic layer G and the optically anisotropic layer H were laminated on the long cellulose acylate film in this order was obtained according to the same procedure as in Comparative Example 3, except that the optically anisotropic layer F was changed to the optically anisotropic layer H. A thickness of the retardation layer E was 5.1 μm.

Production of Circularly Polarizing Plate X5

A circularly polarizing plate X5 was produced according to the same procedure as in Comparative Example 3, except that the retardation layer D was changed to the retardation layer E.

Production of Substitute for Organic EL Display Device (Corresponding to Evaluation Sample)

A substitute for an organic EL display device was produced according to the same procedure as in Comparative Example 3, except that the circularly polarizing plate X4 was changed to the circularly polarizing plate X5. In addition, various evaluations were performed.

Comparative Example 6

Formation of Optically Anisotropic Layer I

An optically anisotropic layer I (thickness: 50 µm) was produced according to the same procedure as in Example 2 described in Examples of JP2014-170221A.

Production of Circularly Polarizing Plate X6

As an UV-curable adhesive, an (active energy ray-curable adhesive composition for an adhesive layer (2b)) described in paragraph 0184 of JP2015-011094A was applied onto a surface (surface opposite to the polarizer protective film) side of the polarizer in the long linearly polarizing plate 1 produced above, to form a coating film. Next, the linearly polarizing plate 1 on which the coating film had been disposed and the surface side of the long optical laminate I produced above were continuously bonded to each other. Thereafter, from the bonded optically anisotropic layer I side, one surface was irradiated with ultraviolet rays (UV) of 800 mJ/cm$^2$ at 50° C., and then dried with hot air at 70° C. for 3 minutes to form an adhesion layer (thickness: 2 µm.

In this way, a circularly polarizing plate X6 was produced. In this case, the polarizer protective film, the polarizer, and the optically anisotropic layer I were laminated in this order, and an angle formed by the absorption axis of the polarizer and the slow axis of the optically anisotropic layer I was 45°. A thickness of the circularly polarizing plate X6 was 85 µm.

Production of Substitute for Organic EL Display Device (Corresponding to Evaluation Sample)

The circularly polarizing plate X6 produced above was bonded to the substitute for an organic EL display panel, produced above, on the aluminum side through a pressure sensitive adhesive layer (thickness: 100 µm, complex elastic modulus: 1.37×10$^5$ Pa) such that the polarizer protective film in the circularly polarizing plate was on the viewing side and the optically anisotropic layer I was on the substitute for an organic EL display panel side, thereby producing a substitute for an organic EL display device. In addition, various evaluations were performed.

In the substitute for an organic EL display device produced above, with respect to the ridge line direction of the substitute for an organic EL display device, the absorption axis of the polarizer was 0°. A position of the absorption axis of the polarizer is expressed as positive in a case where it is clockwise (right-handed turning) and negative in a case where it is counterclockwise (left-handed turning) with the ridge line direction as a reference of 0°, upon observing the substrate from the surface side of the polarizer protective film.

Various Evaluations

Evaluation of Tint Before and After Bending

The substitute for an organic EL display device produced above was bent and fixed with a curvature diameter of 3 mm with the viewing side (circularly polarizing plate side) inward, and held in an environment of 65° C. and 90% humidity for 24 hours. Thereafter, the substitute for an organic EL display device was taken out at normal temperature and humidity, the bending of the substitute for an organic EL display device was returned, tint of the bent portion was visually observed under bright light, and difference in tint was evaluated according to the following standard in comparison with a substitute for an organic EL display device, which was not subjected to the above-described bending treatment at 65° C. and 90% humidity. The results are shown in Table 1.

A: difference in tint was visually recognized before and after bending, but it was very slight.

B: difference in tint was visually recognized before and after bending, which is acceptable.

C: large difference in tint was visually recognized before and after bending, which is unacceptable.

Evaluation of 45° Reflection Tint

Visibility of the substitute for an organic EL display device produced above was evaluated under bright light. Reflected light in a case where a fluorescent lamp was projected was observed from a front surface and at a polar angle of 45°, and the visibility at the polar angle of 45° as compared with that from the front surface was evaluated according to the following standard. The results are shown in Table 1.

A: difference in tint was not visually recognized between the front surface and the oblique direction.

B: difference in tint was visually recognized between the front surface and the oblique direction, but it was very slight.

C: difference in tint was visually recognized between the front surface and the oblique direction.

D: large difference in tint was visually recognized between the front surface and the oblique direction, which is unacceptable.

In the column of "Layer configuration of retardation layer" of Table 1, the layer 1 corresponds to a layer positioned on the polarizer side.

In Table 1, the column of "Polarizer absorption axis with respect to ridge line direction" indicates the position of the absorption axis of the polarizer with respect to the ridge line direction of the substitute for an organic EL display device. A position of the absorption axis of the polarizer is expressed as positive in a case where it is clockwise (right-handed turning) and negative in a case where it is counterclockwise (left-handed turning) with the ridge line direction as a reference of 0°, upon observing the substrate from the surface side of the polarizer protective film.

In Table 1, the column of "Twisted layer slow axis with respect to ridge line direction" indicates the position of the in-plane slow axis of the first optically anisotropic layer, which is formed by fixing a liquid crystal compound twist-aligned along the helical axis extending in the thickness direction, on the surface on the polarizer side, and the position of the in-plane slow axis of the first optically anisotropic layer on the surface on the display panel side with respect to the ridge line direction of the substitute for an organic EL display device. The above-described positions of the in-plane slow axis are expressed as positive in a case where it is clockwise (right-handed turning) and negative in a case where it is counterclockwise (left-handed turning) with the ridge line direction as a reference of 0°, upon observing the substitute for an organic EL display device from the viewing side (surface side of the polarizer protective film).

In Table 1, the column of "Twisted direction of twisted layer" indicates the twisted direction of the liquid crystal compound in the first optically anisotropic layer formed by fixing a liquid crystal compound twist-aligned along the helical axis extending in the thickness direction. The above-described twisted direction of the liquid crystal compound is represented by clockwise or counterclockwise with, as a reference, the in-plane slow axis of the first optically anisotropic layer on the surface on the substitute for an organic EL display device side, upon observing the substitute for an organic EL display device from the viewing side (surface side of the polarizer protective film).

In Table 1, the column of "Requirement" indicates which of the above-described requirements A1 to A8 is satisfied.

In Table 1, the column of "Thickness (μm)" indicates the thickness of the retardation layer.

22: second optically anisotropic layer
24: first optically anisotropic layer

TABLE 1

| | Layer configuration of retardation layer | | | | Polarizer absorption axis with respect to ridge line direction | Twisted layer slow axis with respect to ridge line direction | | Twisted direction of twisted layer | Require-ment | Thick-ness (μm) | Evaluation of tint before and after bending | Evaluation of 45° reflection tint |
|---|---|---|---|---|---|---|---|---|---|---|---|---|
| | Layer 1 | Layer 2 | Layer 3 | Layer 4 | | Polarizer side | Display panel side | | | | | |
| Example 1 | Optically anisotropic layer A | Optically anisotropic layer B | Optically anisotropic layer C | — | 0° | 76° | −5° | Clockwise | A1 | 5.6 | A | B |
| Example 2 | Optically anisotropic layer A | Optically anisotropic layer B | Optically anisotropic layer C | — | 90° | −14° | −95° | Clockwise | A2 | 5.6 | A | B |
| Example 3 | Optically anisotropic layer A | Optically anisotropic layer B | Optically anisotropic layer C | — | −45° | 31° | −50° | Clockwise | A3 | 5.6 | B | B |
| Example 4 | Optically anisotropic layer A | Optically anisotropic layer B | Optically anisotropic layer C | — | 45° | 121° | 40° | Clockwise | A4 | 5.6 | B | B |
| Example 5 | Optically anisotropic layer A | Optically anisotropic layer B | — | — | 0° | 76° | −5° | Clockwise | A1 | 4.9 | A | C |
| Example 6 | Optically anisotropic layer E | Optically anisotropic layer D | Optically anisotropic layer B2 | Optically anisotropic layer C2 | 0° | 79.5° | −5° | Clockwise | A1 | 6.3 | A | A |
| Comparative Example 1 | Optically anisotropic layer A | Optically anisotropic layer B | Optically anisotropic layer C | — | 25° | 101° | 20° | Clockwise | — | 5.6 | C | B |
| Comparative Example 2 | Optically anisotropic layer E | Optically anisotropic layer D | Optically anisotropic layer B2 | Optically anisotropic layer C2 | 25° | 104.5° | 20° | Clockwise | — | 6.3 | C | A |
| Comparative Example 3 | Optically anisotropic layer F | Optically anisotropic layer G | — | — | 0° | — | — | — | — | 5.1 | C | C |
| Comparative Example 4 | Optically anisotropic layer F | Optically anisotropic layer G | — | — | 45° | — | — | — | — | 5.1 | C | C |
| Comparative Example 5 | Optically anisotropic layer H | Optically anisotropic layer G | — | — | 0° | — | — | — | — | 5.1 | C | D |
| Comparative Example 6 | Optically anisotropic layer I | — | — | — | 0° | — | — | — | — | 50 | C | D |

As shown in Table 1, it was confirmed that the organic EL display device according to the embodiment of the present invention exhibited a predetermined effect.

Among these, from the comparison of Examples 1 to 4, it was confirmed that, in a case where the requirement A1 or A2 was satisfied, the effect was more excellent.

In addition, from the comparison between Examples 1 and 5, it was confirmed that, in a case where the organic EL display device included the third optically anisotropic layer, the effect was more excellent.

In addition, from the comparison between Examples 1 and 6, it was confirmed that, in a case where the organic EL display device included the fourth optically anisotropic layer, the effect was more excellent.

EXPLANATION OF REFERENCES 10, 100: organic electroluminescent display device
12: circularly polarizing plate
14: organic electroluminescent display panel
16: polarizer
18: retardation layer
20: fourth optically anisotropic layer
26: third optically anisotropic layer
102: plane portion
104: bending portion

What is claimed is:

1. An organic electroluminescent display device which is bendable, comprising:
   a circularly polarizing plate; and
   a bendable organic EL display panel,
   wherein the circularly polarizing plate includes a polarizer and a retardation layer from a viewing side,
   wherein the retardation layer includes a first optically anisotropic layer formed by fixing a liquid crystal compound twist-aligned along a helical axis extending in a thickness direction,
   wherein a twisted angle of the liquid crystal compound is within a range of 85°±30°, and
   when observing the organic electroluminescent display device from a polarizer side, in a case where a position of an in-plane slow axis of the first optically anisotropic layer on a surface on an organic electroluminescent display panel side and a position of an in-plane slow axis of the first optically anisotropic layer on a surface on the polarizer side are represented by a positive angle value in a clockwise direction and by a negative angle value in a counterclockwise direction with, as a reference, an extending direction of a ridge line formed in a case where the organic electroluminescent display device is bent, when observing the organic electroluminescent display device from the polarizer side, in a case where a twisted direction of the liquid crystal compound is represented by clockwise or counterclockwise with, as a reference, the in-plane slow axis of the first optically anisotropic layer on the surface on the organic electroluminescent display panel side, any of requirements A1 to A8 is satisfied, and wherein in the requirements A1-A8 the in-plane slow axis of the first optically anisotropic layer on the surface on the organic electroluminescent display panel side, and the in-plane slow axis of the first optically anisotropic layer on the surface on the polarizer side, intersect each other on the ridge line;

requirement A1: the in-plane slow axis of the first optically anisotropic layer on the surface on the organic electroluminescent display panel side is positioned within a range of −20° to 10°, the in-plane slow axis of the first optically anisotropic layer on the surface on the polarizer side is positioned within a range of 65° to 95°, and the twisted direction of the liquid crystal compound is clockwise, requirement A2: the in-plane slow axis of the first optically anisotropic layer on the surface on the organic electroluminescent display panel side is positioned within a range of −110° to −80°, the in-plane slow axis of the first optically anisotropic layer on the surface on the polarizer side is positioned within a range of −25° to 5°, and the twisted direction of the liquid crystal compound is clockwise, requirement A3: the in-plane slow axis of the first optically anisotropic layer on the surface on the organic electroluminescent display panel side is positioned within a range of −65° to −35°, the in-plane slow axis of the first optically anisotropic layer on the surface on the polarizer side is positioned within a range of 20° to 50°, and the twisted direction of the liquid crystal compound is clockwise, requirement A4: the in-plane slow axis of the first optically anisotropic layer on the surface on the organic electroluminescent display panel side is positioned within a range of 25° to 55°, the in-plane slow axis of the first optically anisotropic layer on the surface on the polarizer side is positioned within a range of 110° to 140°, and the twisted direction of the liquid crystal compound is clockwise, requirement A5: the in-plane slow axis of the first optically anisotropic layer on the surface on the organic electroluminescent display panel side is positioned within a range of −10° to 20°, the in-plane slow axis of the first optically anisotropic layer on the surface on the polarizer side is positioned within a range of −95° to −65°, and the twisted direction of the liquid crystal compound is counterclockwise, requirement A6: the in-plane slow axis of the first optically anisotropic layer on the surface on the organic electroluminescent display panel side is positioned within a range of 80° to 110°, the in-plane slow axis of the first optically anisotropic layer on the surface on the polarizer side is positioned within a range of −5° to 25°, and the twisted direction of the liquid crystal compound is counterclockwise, requirement A7: the in-plane slow axis of the first optically anisotropic layer on the surface on the organic electroluminescent display panel side is positioned within a range of −55° to −25°, the in-plane slow axis of the first optically anisotropic layer on the surface on the polarizer side is positioned within a range of −140° to −110°, and the twisted direction of the liquid crystal compound is counterclockwise, and requirement A8: the in-plane slow axis of the first optically anisotropic layer on the surface on the organic electroluminescent display panel side is positioned within a range of 35° to 65°, the in-plane slow axis of the first optically anisotropic layer on the surface on the polarizer side is positioned within a range of −50° to −20°, and the twisted direction of the liquid crystal compound is counterclockwise.

2. The organic electroluminescent display device according to claim 1, wherein when observing the organic electroluminescent display device from the polarizer side, in a case where a position of an absorption axis of the polarizer is represented by a positive angle value in a clockwise direction and by a negative angle value in a counterclockwise direction with, as a reference, the extending direction of the ridge line formed in a case where the organic electroluminescent display device is bent, any of requirements B1 to B8 is satisfied, requirement B1: the requirement A1 is satisfied, and the absorption axis of the polarizer is positioned within a range of −10° to 10° requirement B2: the requirement A2 is satisfied, and the absorption axis of the polarizer is positioned within a range of 80° to 100° requirement B3: the requirement A3 is satisfied, and the absorption axis of the polarizer is positioned within a range of −55° to −35° requirement B4: the requirement A4 is satisfied, and the absorption axis of the polarizer is positioned within a range of 35° to 55° requirement B5: the requirement A5 is satisfied, and the absorption axis of the polarizer is positioned within a range of −10° to 10° requirement B6: the requirement A6 is satisfied, and the absorption axis of the polarizer is positioned within a range of 80° to 100° requirement B7: the requirement A7 is satisfied, and the absorption axis of the polarizer is positioned within a range of −55° to −35° requirement B8: the requirement A8 is satisfied, and the absorption axis of the polarizer is positioned within a range of 35° to 55°.

3. The organic electroluminescent display device according to claim 1, wherein the retardation layer includes a second optically anisotropic layer which is a negative A-plate.

4. The organic electroluminescent display device according to claim 3, wherein the retardation layer includes a third optically anisotropic layer which is a positive C-plate.

5. The organic electroluminescent display device according to claim 4,
wherein the retardation layer includes a fourth optically anisotropic layer which is a negative C-plate.

6. The organic electroluminescent display device according to claim 1,
wherein the retardation layer includes a third optically anisotropic layer which is a positive C-plate.

7. The organic electroluminescent display device according to claim 1,
wherein the retardation layer includes a fourth optically anisotropic layer which is a negative C-plate.

8. The organic electroluminescent display device according to claim 1,
wherein a thickness of the retardation layer is 20 μm or less.

\* \* \* \* \*